(12) United States Patent
Furceri et al.

(10) Patent No.: US 12,187,604 B2
(45) Date of Patent: Jan. 7, 2025

(54) METHOD TO ESTIMATE PHASE AND AMPLITUDE FOR CONTROL OF A RESONANT MEMS MIRROR

(71) Applicant: STMicroelectronics S.r.l., Agrate Brianza (IT)

(72) Inventors: Raffaele Enrico Furceri, Legnano (IT); Luca Molinari, Piacenza (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 468 days.

(21) Appl. No.: 17/583,896

(22) Filed: Jan. 25, 2022

(65) Prior Publication Data
US 2023/0234836 A1    Jul. 27, 2023

(51) Int. Cl.
*B81B 7/00*     (2006.01)
*B81B 3/00*     (2006.01)
*G02B 26/08*    (2006.01)

(52) U.S. Cl.
CPC ............ *B81B 7/008* (2013.01); *B81B 3/0043* (2013.01); *B81B 2207/03* (2013.01); *G02B 26/0833* (2013.01)

(58) Field of Classification Search
CPC ............... G02B 26/105; G02B 26/101; G02B 26/0833; B81B 7/008; B81B 3/0043; B81B 2207/03
USPC ......................................................... 318/608
See application file for complete search history.

(56) References Cited

U.S. PATENT DOCUMENTS

| | | | | |
|---|---|---|---|---|
| 7,224,759 B2 * | 5/2007 | White | ............... | G01C 19/5649 375/376 |
| 2004/0008800 A1 * | 1/2004 | White | ................... | G01C 19/42 375/376 |
| 2012/0235724 A1 * | 9/2012 | Mokhtar | ............ | G01C 19/5776 327/261 |
| 2013/0120819 A1 * | 5/2013 | Rothaar | ............... | H04N 9/3185 359/224.1 |
| 2018/0129036 A1 * | 5/2018 | Haran | ................ | G01R 31/2829 |
| 2018/0164579 A1 | 6/2018 | Haran et al. | | |

(Continued)

FOREIGN PATENT DOCUMENTS

| | | |
|---|---|---|
| CN | 101626220 A | 5/2011 |
| CN | 111578923 A | 8/2020 |

(Continued)

OTHER PUBLICATIONS

Gu, Haoyu, et al: "A Design Methodology of Digital Control System for MEMS Gyroscope Based on Multi-Objective Parameter Optimization," Micromachines 2020, 11, 75; doi: 10.3390/mi11010075, 16 pages.

(Continued)

*Primary Examiner* — Gabriel Agared
(74) *Attorney, Agent, or Firm* — Crowe & Dunlevy LLC

(57) ABSTRACT

Techniques to be described herein are based upon the combination of a digital lock-in amplifier approach with a numerical method to yield accurate estimations of the amplitude and phase of a sense signal obtained from a movement sensor associated with a resonant MEMS device such as a MEMS mirror. The techniques described herein are efficient from a computational point of view, in a manner which is suitable for applications in which the implementing hardware is to follow size and power consumption constraints.

17 Claims, 17 Drawing Sheets

(56) References Cited

U.S. PATENT DOCUMENTS

| | | | |
|---|---|---|---|
| 2019/0186917 A1* | 6/2019 | Dakshinamurthy | ........................ G01C 19/5776 |
| 2020/0249465 A1 | 8/2020 | Kinstlich et al. | |
| 2021/0223536 A1 | 7/2021 | Brunner et al. | |
| 2021/0271072 A1 | 9/2021 | Schroedter et al. | |
| 2021/0311300 A1 | 10/2021 | Van Lierop et al. | |

FOREIGN PATENT DOCUMENTS

| | | |
|---|---|---|
| DE | 102009058762 A1 | 6/2011 |
| EP | 3121709 A1 | 1/2017 |
| JP | 2017203840 A | 11/2017 |
| WO | 2015155044 A1 | 10/2015 |

OTHER PUBLICATIONS

EPO Search Report and Written Opinion for counterpart EP Appl. No. 23152162, report dated Jun. 7, 2023, 12 pgs.

Hofmann M et al: "Implementation of a dual-phase lock-in amplifier on a TMS320C5515 digital signal processor", Education and Research Conference (EDERC), 2012 5th European DSP, IEEE, Sep. 13, 2012 (Sep. 13, 2012), pp. 20-24, XP032777768.

Poik Mathias et al: "A Mechatronic Lock-In Amplifier: Integrating Demodulation in Sensor Electronics for Measuring Mechanical Oscillations", IEEE Transactions on Instrumentation and Measurement, IEEE, USA, vol. 70, Dec. 24, 2020 (Dec. 24, 2020), pp. 1-8, XP011833088.

* cited by examiner

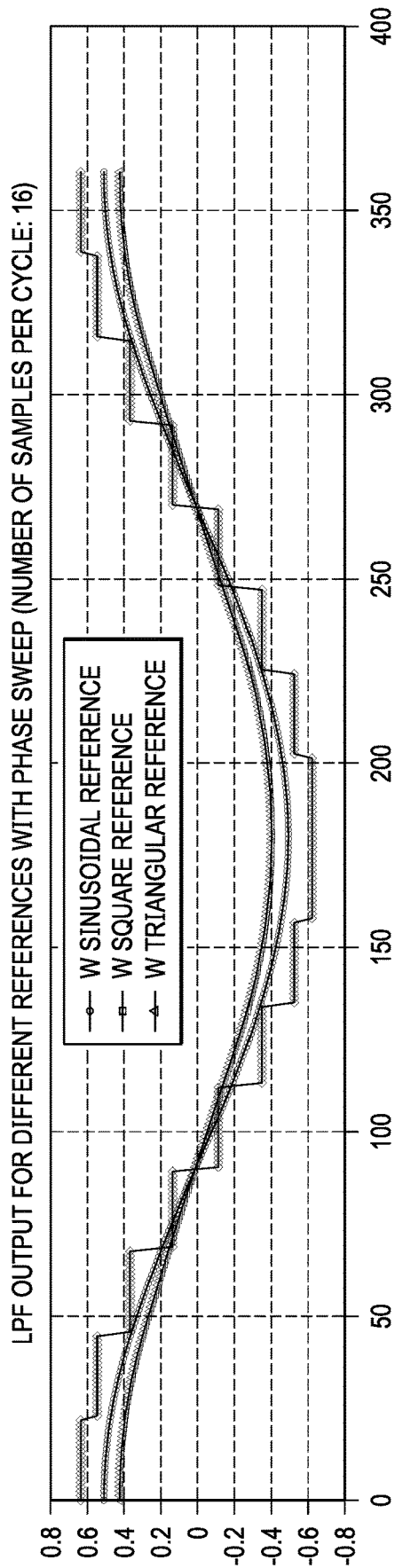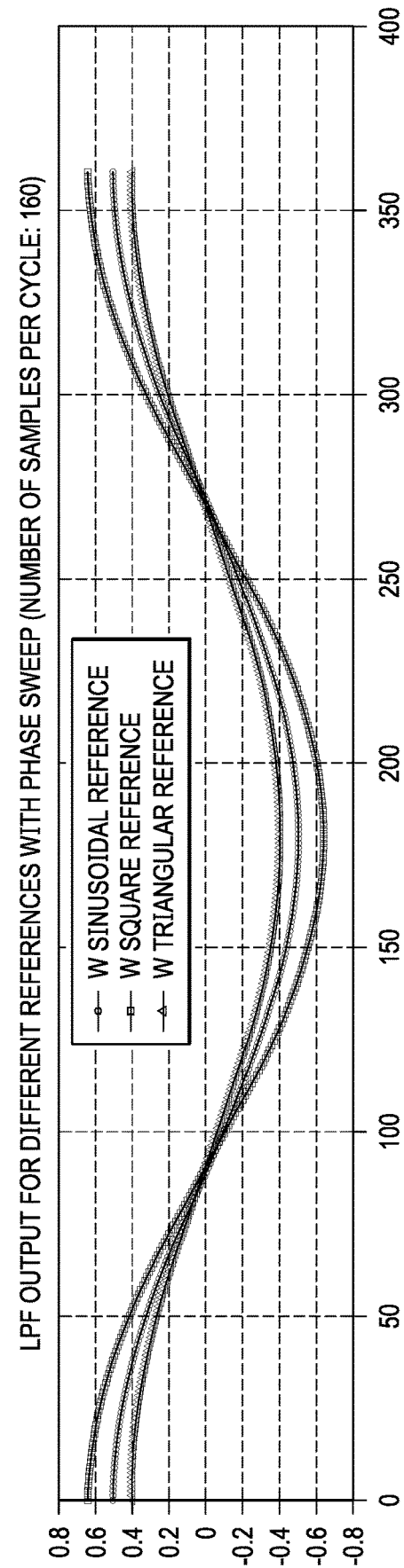
FIG. 7

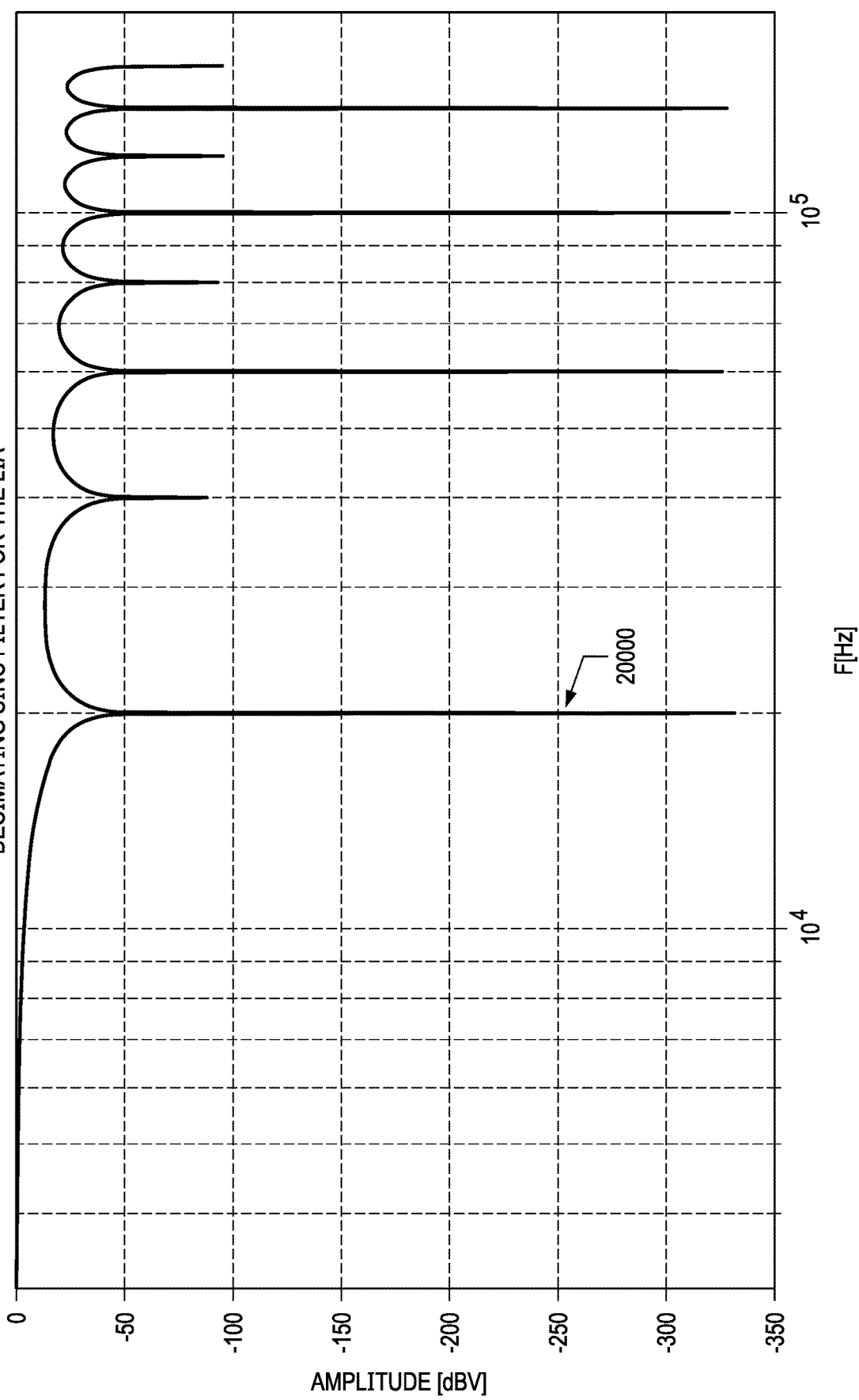

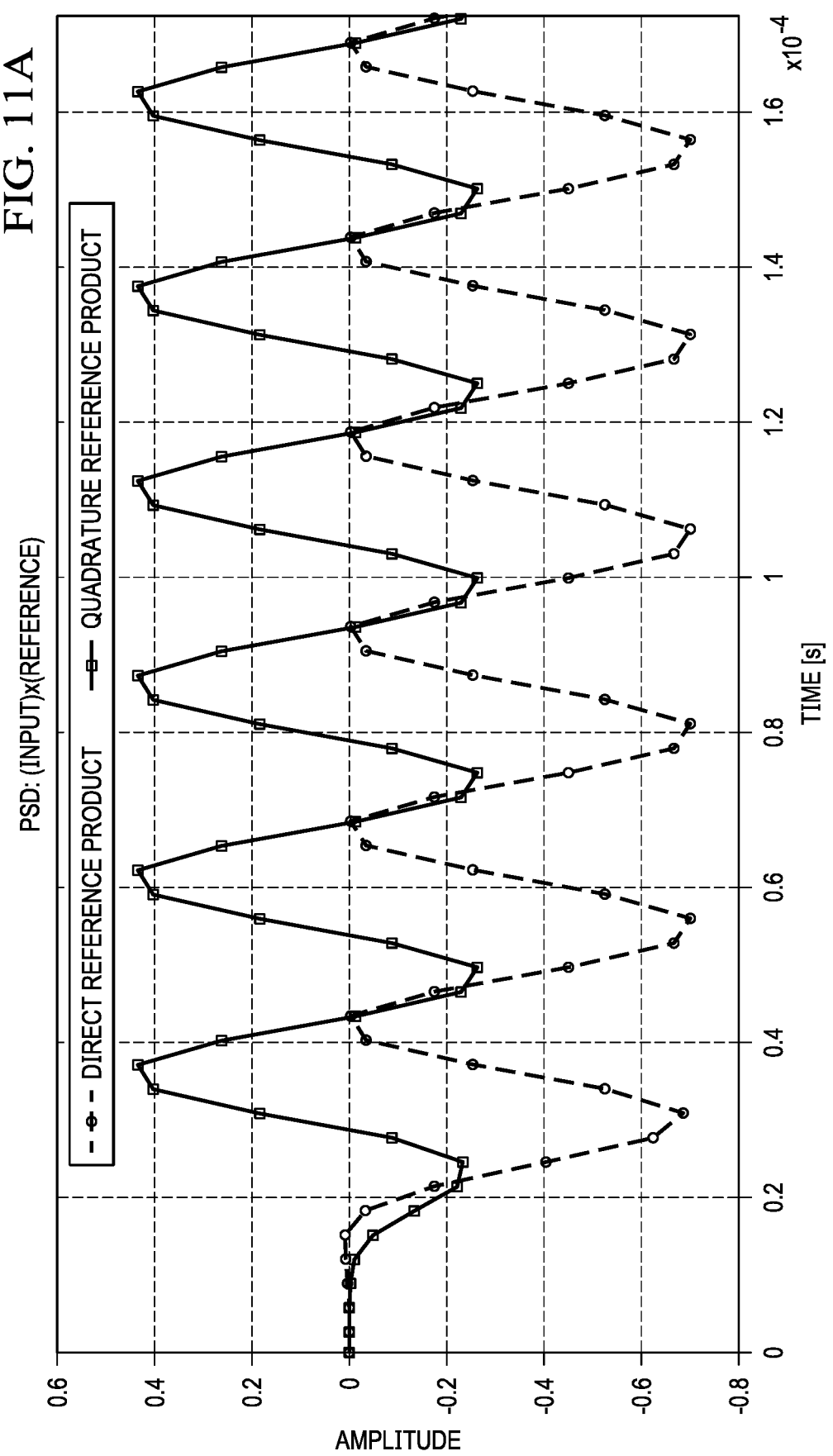

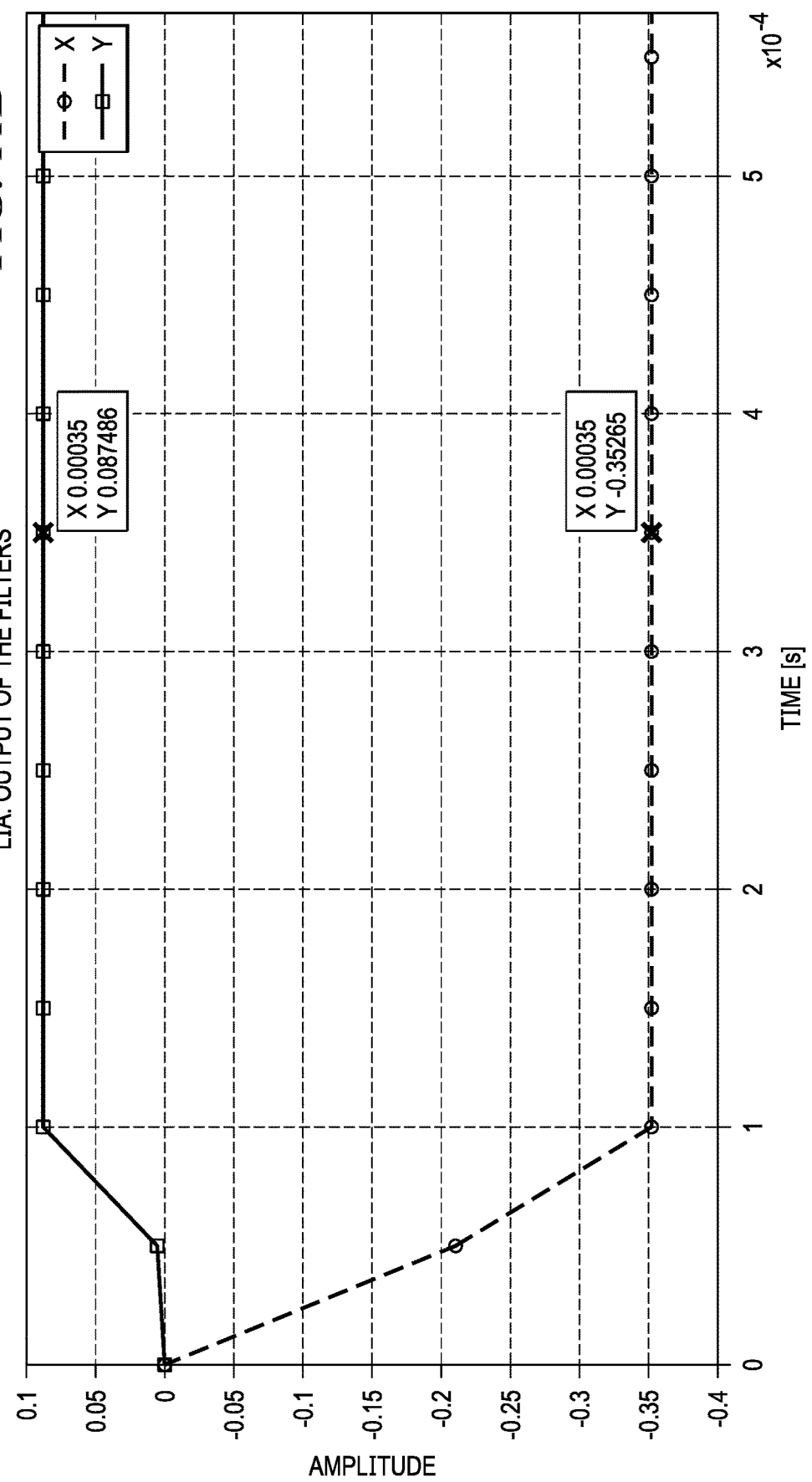

METHOD TO ESTIMATE PHASE AND AMPLITUDE FOR CONTROL OF A RESONANT MEMS MIRROR

TECHNICAL FIELD

This disclosure is related to the field of resonant MEMS device control and, in particular, is related to techniques for estimating the phase and amplitude of a sense signal containing information about the movement of a resonant MEMS device, said techniques being performable using computationally simple operations.

BACKGROUND

A laser scanning projector is a small, portable electronic device. Laser scanning projectors are typically paired to, or incorporated within, user devices such as smart glasses, smartphones, tablets, laptops, depth sensing cameras, or LIDAR, and used to project virtual and augmented reality, documents, images, or video stored on those user devices onto a projection surface, such as a wall, holographic surface, or inner display surface of virtual or augmented reality glasses (for example a wave guide in a coupling window).

Laser scanning projectors are also incorporated within distance determination systems within vehicles to determine information about the vehicles relative to their surroundings, permitting the creation of advanced driver assistance systems.

Such laser scanning projectors typically include a projection subsystem and an optical module. The paired user device serves an image stream (e.g., a video stream, or a pattern projected into an area used for distance determination) to the projection subsystem. The projection subsystem properly drives the optical module to project the image stream onto the projection surface or environment for viewing.

In greater detail, typical optical modules are comprised of a laser source and one or more microelectromechanical (MEMS) mirrors that scan the laser beam produced by the laser source across the projection surface in a projection pattern. By modulating the laser beam (in the case of an image projection system) according to its position on the projection surface, while the laser beam is scanned in the projection pattern, the image stream is displayed.

The projection subsystem controls the driving of the laser source and the driving of the movement of the one or more MEMS mirrors. Typically, the driving of movement of one of the MEMS mirrors is at, or close to, the resonance frequency of that MEMS mirror.

Monitoring of the mirror movement of the one or more MEMS mirrors is performed by the projection subsystem to provide feedback about the operation of the mirror movement so that the driving of the movement of the one or more MEMS mirrors may be adjusted accordingly to maintain the movement as desired. For example, feedback may be used to maintain the one or more MEMS mirrors operating at a given opening angle.

A sample prior art laser scanning projector 10 is now described with reference to FIG. 1A. Here, the laser source and its associated control circuitry are not shown but are understood to be present. The MEMS mirror 11 (also referred to as a micromirror) is driven at resonance by a drive signal Drv generated by drive circuitry 12. A sensor 13, such as a piezoresistive based sensor, is used to generate a sense signal Sns in response to the movements of the MEMS mirror 11.

Phase feedback circuitry 20 receives the drive signal Drv and sense signal Sns as input, and generates therefrom a frequency signal Fdrive instructing the drive circuitry 12 at what frequency and phase to generate the drive signal Drv.

Amplitude feedback circuitry 30 receives the sense signal Sns as input and from it generates a drive voltage signal Vdrive instructing the drive circuitry 12 at what voltage to generate the drive signal Drv.

Details of the phase feedback circuitry 20 and amplitude feedback circuitry 30 will be given below, but first a mathematical discussion of operation of MEMS mirrors at resonance is presented.

A resonant MEMS mirror can be considered to behave as a second-order filter, mathematically represented as:

$$H(s) = \frac{H_0 \cdot \omega_0^2}{s^2 + \frac{\omega_0}{Q}s + \omega_0^2}$$

Here, $\omega_0$ represents the natural frequency of the mirror, Q is the quality factor of the mirror and $H_0$ is the DC gain.

The magnitude response of a resonant MEMS mirror represents its opening angle and can be mathematically represented as:

$$M(\omega) = \frac{H_0 \cdot \omega_0^2}{\sqrt{(\omega - \omega_0)^2 + \left(\frac{\omega_0}{Q}\omega\right)^2}}$$

Here, $\omega$ represents the current frequency of the resonant MEMS mirror (as determined from a sense signal generated by a mirror sensor associated with the mirror).

The phase response $\varphi$ of a resonant MEMS mirror represents the delay between the drive signal and the mirror, and can be mathematically represented as:

$$\varphi(\omega) = -\mathrm{atan}\left(\frac{2Q}{\omega_0}\omega + \sqrt{4Q^2 - 1}\right) - \mathrm{atan}\left(\frac{2Q}{\omega_0}\omega - \sqrt{4Q^2 - 1}\right)$$

At resonance, a resonant MEMS mirror as indicated by the sense signal responds with a specific phase value with respect to the driving signal, and the drive signal and sense signal are in phase quadrature.

When a resonant MEMS mirror is operated at resonance, for a given voltage of the drive signal, the resonant MEMS mirror is opened to a wider opening angle and, for a specific opening angle, requires a lower voltage drive signal. During operation, the frequency of the drive signal is to therefore to be set to maintain the drive signal and the sense signal as being in phase quadrature to maintain resonance, and the voltage of the drive signal is to be set to maintain the drive signal at a specific voltage to maintain a desired opening angle of the resonant MEMS mirror.

Therefore, during operation of the laser scanning projector 10, the phase feedback circuitry 20 generates the frequency signal Fdrive based upon the feedback of the drive signal Drv and the sense signal Sns so as to maintain the drive signal Drv and sense signal Sns in phase quadrature, and the amplitude feedback circuitry 30 generates the drive voltage signal Vdrive so as to maintain the voltage of the drive signal at a desired voltage to achieve a desired opening angle of the MEMS mirror 11.

The phase feedback circuitry 20 includes a phase estimator 21 that receives the drive signal Drv and sense signal Sns, and generates therefrom a phase φ, indicative of a phase shift between Drv and Sns. An error amplifier 22 compares the phase φ to a target phase φtarget, and generates a phase error φerror as an indication of the difference between φ and φtarget. A phase controller 23 generates a tuning signal PLLfrac to adjust the output frequency generated by a fractional phase locked loop (PLL) 24 from which the frequency signal Fdrive is adjusted to bring φerror to zero. The frequency of the drive signal Drv as generated by the drive circuitry 12 is set to match the frequency of Fdrive. It is understood that even though we PLL circuitry 24 is referred to herein, the driving frequency could also be generated by any programmable oscillator, and that the use of a PLL is simply an example.

The amplitude feedback circuitry 30 includes an amplitude estimator 31 that receives the sense signal Sns as input and generates an amplitude A as being representative of the amplitude of the sense signal Sns. An error amplifier 32 compares the amplitude A to a target amplitude Atarget and generates an amplitude error signal Aerror as an indication of the difference between A and Atarget. An amplitude controller 33 generates a voltage signal Vdrive that drives Aerror to zero. The amplitude of the drive signal Drv as generated by the drive circuitry 12 is set to match the amplitude of Vdrive.

The estimation of the phase shift between the drive signal Drv and sense signal Sns is now described.

A sample drive signal and sense signal are shown in FIG. 1B, with the drive signal being a square wave and the sense signal being a sinusoid. The drive signal can be mathematically represented as a square-wave voltage whose amplitude is Vdrive and fundamental frequency is $\omega_{drive}$.

$$\text{drive}(t) = V\text{drive} \cdot \text{square}(\omega_{drive} \cdot t)$$

The sense signal can be mathematically represented as:

$$\text{sense}(t) = A\text{sense} \cdot \sin(\omega_{sense} \cdot t + \varphi_{sense})$$

Here, Asense is the amplitude of the sense signal, $\omega_{sense}$ is the frequency of the sense signal, and $\varphi_{sense}$ is the phase of the sense signal with respect to the driver.

A first known technique for estimating the phase shift Φ between the drive signal and the sense signal is described with reference to FIG. 1C. In this graph, zero crosses of the drive signal and sense signal have been estimated and are represented as the rectangular signals $ZC_{sense}$ and $ZC_{drive}$, and a number of cycles of the system clock $SYS_{clk}$ between a rising edge of the zero crossing sense signal $ZC_{sense}$ and a rising edge of the zero crossing drive signal $ZC_{drive}$ are calculated. From this, the phase shift between the drive signal and the sense signal can be estimated. However, this estimation may be too coarse for high frequency MEMS mirrors (which have high frequency drive signals), and the zero cross estimation of the sense signal itself may be insufficiently accurate depending upon the sampling rate. The insufficient accuracy of the zero cross estimation is generally due to the need for extra processing techniques (for accurate zero cross event detections) and faster clock frequencies (for higher time resolutions).

A second known technique for estimating the phase shift between the drive signal and the sense signal is described with reference to FIG. 1D. Keep in mind that the following is not a direct computation of a phase shift in the strict sense thereof, but instead is an indirect estimation of the phase shift, which is useful when, as explained, the sense signal is sampled at two constant (and potentially symmetrical) locations. Here, the sense signal is sampled at two constant locations per cycle—in the illustrated example, the samples are taken at π/2, and 3π/2 of the cycle of the sense signal. The phase shift Φ may then be calculated as:

$$\text{Phase Shift } \Phi = \frac{\text{Sample2} - \text{Sample1}}{\text{Asense}}$$

The limitations here are that an accurate estimation of the amplitude Asense of the sense signal is required for normalization, and that the samples themselves and the timing thereof must be accurate in order to yield an accurate estimation of the phase shift.

A first known technique for estimation of the amplitude of the sense signal is shown in FIG. 1E. Here, the sense signal has been sampled at two different sampling rates. The outer illustrated curve 1 represents the sense signal as sampled at a rate of 8192 samples per mirror cycle, and the inner illustrated curve 2 represents the sense signal as samples at a rate of 16 samples per mirror cycle. This illustrates the issue with using a low sampling rate. In the case where 16 samples per mirror cycle is used, the highest sample has a value of 0.9859 when the true amplitude of the sense signal is 1, which represent a 1.41% error that may be unacceptable for many applications. Utilizing a high sampling rate, however, consumes excess power and requires a high frequency analog-to-digital converter.

A second known technique for estimation of the amplitude of the sense signal is shown in FIG. 1F. Here, interpolation is used to determine the maximum value of the sense signal, said interpolation being based upon samples of the sense signal and user-specified phase coordinates. However, the phase coordinates must be accurately determined, otherwise the interpolated peak value may not be accurate, and this requires an undesirable amount of computational resources. In addition, the tuning of the interpolation point locations makes the system calibration stages more time consuming and more burdensome to address.

In the above examples of phase shift and amplitude estimation that rely upon samples, bandpass filtering is performed to clear noise, such bandpass filtering requiring a high amount of computational resources in order to provide the needed performance, adding a further challenge and drawback to the usage of such techniques. Also, some of the above examples require that the MEMS mirror be locked at resonance prior to opening angle determination, which involves obtaining additional samples placed at sense peaks, adding even more complexity.

Prior solutions have been found to yield poor results when estimations (and control loops are implemented directly on hardware like application specific integrated circuits (ASICs), where few computational resources are available, and both area and power consumption are challenging aspects (meaning high clock frequencies and sampling rates cannot be afforded).

As such, current techniques for phase shift and amplitude estimation (e.g., current implementations of the phase estimator 21 and amplitude estimator 31 described above with reference to FIG. 1) are less than ideal, and further development is needed. Indeed, the challenge to be addressed is essentially how to perform such estimations accurately enough when few hardware resources are available.

SUMMARY

Disclosed herein is a method of operating a micro-electro mechanical systems (MEMS) device. The method includes: driving the MEMS device with a drive signal; sensing movement of the MEMS device caused by the drive signal, and generating a sense signal indicative of the movement; using a rotation-matrix approach to generate a reference cosine wave and a reference sine wave, the reference cosine wave and reference sine wave each having an amplitude of 1 and a same frequency as that of the sense signal; multiplying the sense signal by the reference sine wave to produce a first product; multiplying the sense signal by the reference cosine wave to produce a second product; low-pass filtering the first product to produce a first intermediate output; low-pass filtering the second product to produce a second intermediate output; performing a 4-quadrant CORDIC technique on the first and second intermediate outputs to thereby determine a phase shift between the sense signal and the drive signal as well as an amplitude of the sense signal; comparing the phase shift to a target phase shift to produce a phase error as a difference therebetween; comparing the amplitude of the sense signal to a target amplitude to thereby produce an amplitude error as a difference therebetween; and modifying the drive signal based upon the phase error and the amplitude error so that the phase error and amplitude error are eliminated.

The method may include digitizing the sense signal prior to multiplication by the reference sine and cosine waves, and the reference sine and cosine waves may be generated in digital form.

The low-pass filtering of the first product may serves to remove intermodulation components from the reference sine wave, and the low-pass filtering of the second product may serve to remove intermodulation components from the reference cosine wave.

The low-pass filtering of the first product may be performed using a first decimation SINC filter, and the low-pass filtering of the second product may be performed using a second decimation SINC filter.

Performing the 4-quadrant CORDIC technique may be accomplished by:
a) defining an index i having integer values ranging from 0 to N−1, with N being the total amount of CORDIC iterations;
b) precalculating N angles $\theta_i$ such that for each of the N angles, $\tan(\theta_i)=2^{-i}$;
c) determining a starting coordinate set $X_0$, $Y_0$ from the two SINC outputs (i.e. Y and X);
d) If X>=0, setting $\Delta\theta$=0 as a starting point, else if X<0, then if Y>0 setting $\Delta\theta$=+180, else setting $\Delta\theta$=−180. Also, rotating the starting X, Y coordinates by 180° by setting X=−X and Y=−Y;
e) for a first number i=0 in the index, setting a next coordinate set $X_1$, $Y_1$ to be such that $X_1=X_0-(Y_0>>0)$ and $Y_1=Y_0+(X_0>>0)$ and determine a phase $\Delta\theta=\Delta\theta-\theta_i$ if $Y_0 \leq 0$, but setting the next coordinate set $X_1$, $Y_1$ to be such that $X_1=X_0+(Y_0>>0)$ and $Y_1=Y_0-(X_0>>0)$ and determine the phase $\Delta\theta=\Delta\theta+\theta_i$, if $Y_0>0$;
f) incrementing i by one;
g) for an ith number i in the index, setting a next coordinate set Xi, Yi to be such that $X_{i+1}=X_i-(Y_i>>i)$ and $Y_{i+1}=Y_i+(X_i>>i)$ and determine a phase $\Delta\theta=\Delta\theta-\theta_i$ if $Y_i \leq 0$, but setting the next coordinate set $X_{i+1}$, $Y_{i+1}$ to be such that $X_{i+1}=X_i+(Y_i>>i)$ and $Y_{i+1}=Y_i-(X_i>>i)$ and determine the phase $\Delta\theta=\Delta\theta+\theta_i$, if $Y_i>0$;
h) if i<N−1, return to f); and
i) if i=N−1:
determine the phase shift as being equal to the phase $\Delta\theta$ and
determine the amplitude of the sense signal as being equal to $K \cdot X_{N-1}$, being $K=2 \cdot \Pi_{i=0}^{N-1} \cos(\theta_i)$.

The rotation-matrix approach may performed by:
a) defining an index i having integer values ranging from 0 to N−1, with N being the number of samples per reference cycle;
b) determining a rotation amount as being equal to 360°/N and precalculating the (x_rot; y_rot)=(cos(360/N); sin(360/N)) rotation coordinates;
c) determining a starting coordinate set $X_0$, $Y_0$, where $x_0=\cos(\varphi_{ref})$, $y_0=\sin(\varphi_{ref})$, with $\varphi_{ref}$ being equal to the initial phase shift for the reference waves;
d) rotating the start coordinate set $X_0$, $Y_0$ by the rotation amount to produce a next coordinate set $X_1$, $Y_1$ as $X_1=X_0 \cdot x_{rot}-Y_0 \cdot y_{rot}$ and $Y_1=X_0 \cdot y_{rot}+Y_0 \cdot x_{rot}$;
e) incrementing i by 1;
f) rotate the coordinate set $X_1$, $Y_1$ by the rotation amount to produce an ith coordinate set $X_i$, $Y_i$ as $X_{i+1}=X_i \cdot x_{rot}-Y_i \cdot y_{rot}$ and $Y_{i+1}=X_i \cdot y_{rot}+Y_i \cdot x_{rot}$;
g) if i<N−1, return to e); and
h) if i=N−1, reset the index to 0, and start over from c).

Also disclosed herein is a system for driving micro-electro mechanical systems (MEMS) device. The system includes: a driver generating a drive signal for the MEMS device; a sensor associated with the MEMS device and generating an output indicative of movement of the MEMS device; an analog to digital converter digitizing the output of the sensor to produce a sense signal indicative of movement of the MEMS device; a reference generator using a rotation-matrix approach to generate a reference cosine wave and a reference sine wave based upon a frequency drive signal, the reference cosine wave and reference sine wave each having an amplitude of 1 and a same frequency as that of the sense signal; and a processing circuit. The processing circuit is configured to: multiply the sense signal by the reference sine wave to produce a first product; multiply the sense signal by the reference cosine wave to produce a second product; low-pass filter the first product to produce a first intermediate output; low-pass filter the second product to produce a second intermediate output; and perform a 4-quadrant CORDIC technique on the first and second intermediate outputs to thereby determine a phase shift between the sense signal and the drive signal as well as an amplitude of the sense signal. The system also includes: a first error amplifier comparing the amplitude of the sense signal to a target amplitude to thereby produce an amplitude error as a difference therebetween; a second error amplifier comparing the phase shift to a target phase shift to produce a phase error as a difference therebetween; and controller circuitry causing modifying of the drive signal based upon the phase error and the amplitude error so that the phase error and amplitude error are eliminated.

The controller circuitry may include: a phase controller generating a PLL control signal based upon the phase error; a phase locked loop (PLL) generating the frequency drive signal based upon the PLL control signal, the driver modifying phase of the drive signal based upon the frequency drive signal such that the phase error is eliminated; and an amplitude controller generating a voltage drive signal to the driver based upon the amplitude error, the driver modifying amplitude of the drive signal based upon the voltage drive signal such that the amplitude error is eliminated.

The processing circuit may be an application specific integrated circuit (ASIC).

The low-pass filtering of the first product may be performed by the processing circuit serves to remove intermodulation components from the reference sine wave, and the low-pass filtering of the second product may be performed by the processing circuit serves to remove intermodulation components from the reference cosine wave.

The low-pass filtering of the first product may be performed by the processing circuit using a first decimation SINC filter, and the low-pass filtering of the second product may be performed by the processing circuit using a second decimation SINC filter.

The processing circuit may perform the 4-quadrant CORDIC technique by:
  a) defining an index i having integer values ranging from 0 to N−1, with N being the total amount of CORDIC iterations;
  b) precalculating N angles $\theta_i$ such that for each of the N angles, $\tan(\theta_i)=2^{-i}$;
  c) determining a starting coordinate set $X_0$, $Y_0$ from the two SINC outputs (i.e. Y and X);
  d) If X>=0, setting $\Delta\theta=0$ as a starting point, else if X<0, then if Y>0 setting $\Delta\theta=+180$, else setting $\Delta\theta=-180$. Also, rotating the starting X, Y coordinates by 180° by setting X=−X and Y=−Y;
  e) for a first number i=0 in the index, setting a next coordinate set $X_1$, $Y_1$ to be such that $X_1=X_0-(Y_0>>0)$ and $Y_1=Y_0+(X_0>>0)$ and determine a phase $\Delta\theta=\Delta\theta-\theta_i$ if $Y_0\leq 0$, but setting the next coordinate set $X_1$, $Y_1$ to be such that $X_1=X_0+(Y_0>>0)$ and $Y_1=Y_0-(X_0>>0)$ and determine the phase $\Delta\theta=\Delta\theta+\theta_i$, if $Y_0>0$;
  f) incrementing i by one;
  g) for an ith number i in the index, setting a next coordinate set Xi, Yi to be such that $X_{i+1}=X_i-(Y_i>>i)$ and $Y_{i+1}=Y_i+(X_i>>i)$ and determine a phase $\Delta\theta=\Delta\theta-\theta_i$ if $Y_i\leq 0$, but setting the next coordinate set $X_{i+1}$, $Y_{i+1}$ to be such that $X_{i+1}=X_i+(Y_i>>i)$ and $Y_{i+1}=Y_i-(X_i>>i)$ and determine the phase $\Delta\theta=\Delta\theta+\theta_i$, if $Y_i>0$;
  h) if i<N−1, return to f); and
  i) if i=N−1:
    determine the phase shift as being equal to the phase $\Delta\theta$ and
    determine the amplitude of the sense signal as being equal to $K \cdot X_{N-1}$, being $K=2 \cdot \Pi_{i=0}^{N-1} \cos(\theta_i)$.

The processing circuit may perform the rotation-matrix by:
  a) defining an index i having integer values ranging from 0 to N−1, with N being the number of samples per reference cycle;
  b) determining a rotation amount as being equal to 360°/N and precalculating the (x_rot; y_rot)=(cos(360/N); sin(360/N)) rotation coordinates;
  c) determining a starting coordinate set $X_0$, $Y_0$, where $x_0=\cos(\varphi_{ref})$, $y_0=\sin(\varphi_{ref})$, with $\varphi_{ref}$ being equal to the initial phase shift for the reference waves;
  d) rotating the start coordinate set $X_0$, $Y_0$ by the rotation amount to produce a next coordinate set $X_1$, $Y_1$ as $X_1=X_0 \cdot x_{rot}-Y_0 \cdot y_{rot}$ and $Y_1=X_0 \cdot y_{rot}+Y_0 \cdot x_{rot}$;
  e) incrementing i by 1;
  f) rotate the coordinate set $X_1$, $Y_i$ by the rotation amount to produce an ith coordinate set $X_i$, $Y_i$ as $X_{i+1}=X_i \cdot x_{rot}-Y_i \cdot y_{rot}$ and $Y_{i+1}=X_i \cdot y_{rot}+Y_i \cdot x_{rot}$;
  g) if i<N−1, return to e); and
  h) if i=N−1, reset the index to 0, and start over from c).

BRIEF DESCRIPTION OF THE DRAWINGS

FIG. 7 contains graphs showing the output provided by the low-pass filter of FIG. 3 when the reference waves are generated by the reference generator as being sinusoidal, square, and triangular, for different sampling rates.

FIG. 10 is a graph illustrating the frequency response of a decimating SINC filter such as may be used for the low-pass filters of FIG. 3.

FIG. 11A is a graph showing the signals x(t) and y(t) generated by the demodulators of FIG. 3.

FIG. 11B is a graph showing the outputs X and Y of the filters of FIG. 3.

DETAILED DESCRIPTION

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein.

Techniques to be described herein are based upon the combination of a digital lock-in amplifier approach with a numerical method to yield accurate estimations of the amplitude and phase of a sense signal obtained from a movement sensor associated with a resonant MEMS device such as a MEMS mirror. The techniques described herein are efficient from a computational point of view, in a manner which is suitable for applications in which the implementing hardware is to follow size and power consumption constraints.

First, the mathematical underpinnings of the techniques described herein will be discussed, and then the practical application and realization of those techniques will be discussed together with the uses thereof in real world applications to provide for accurate control of resonant MEMS mirrors using these techniques.

Figure 1A:
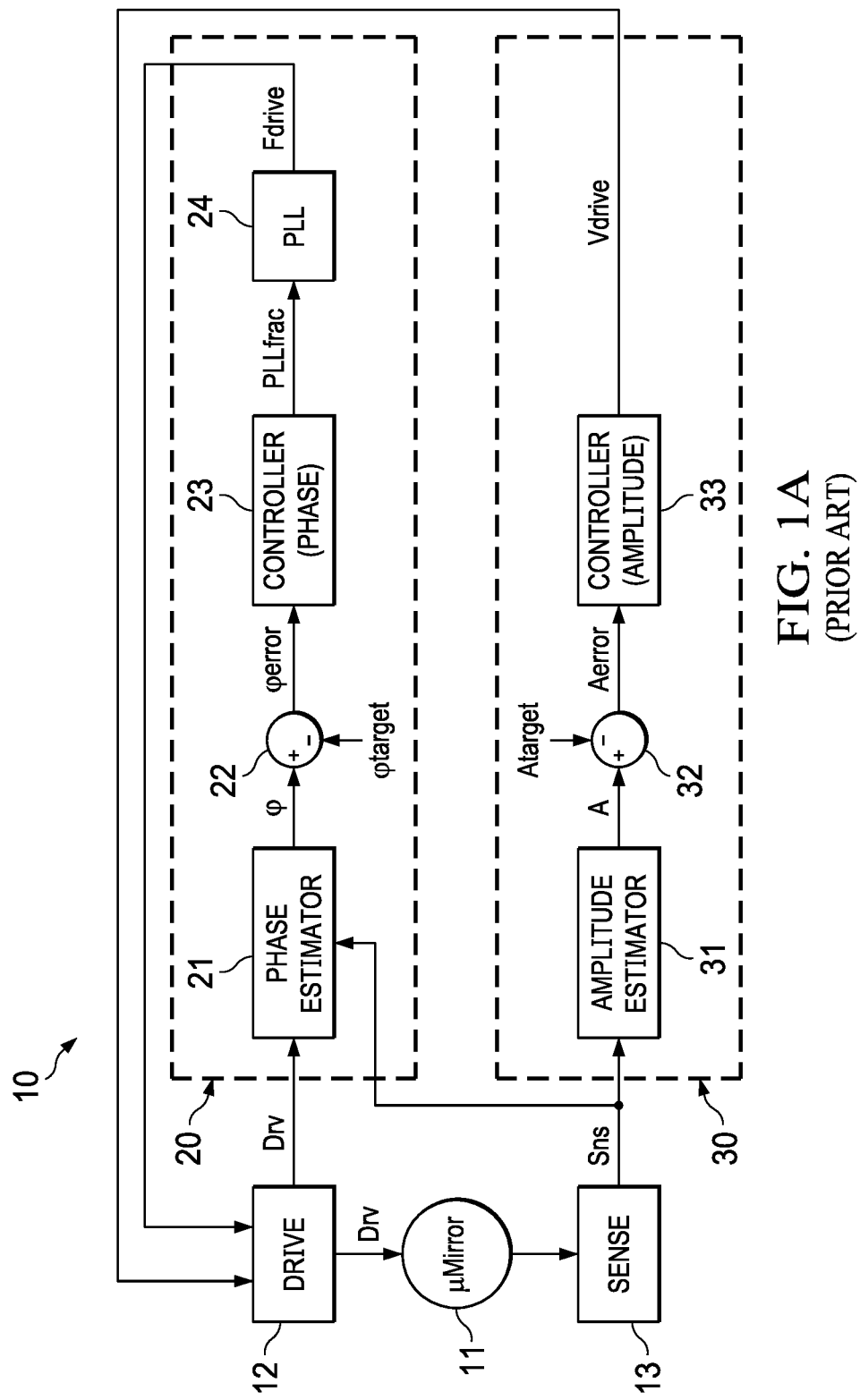
FIG. 1A is a block diagram of a laser scanning projector utilizing prior art control loops.
Figure 1B:
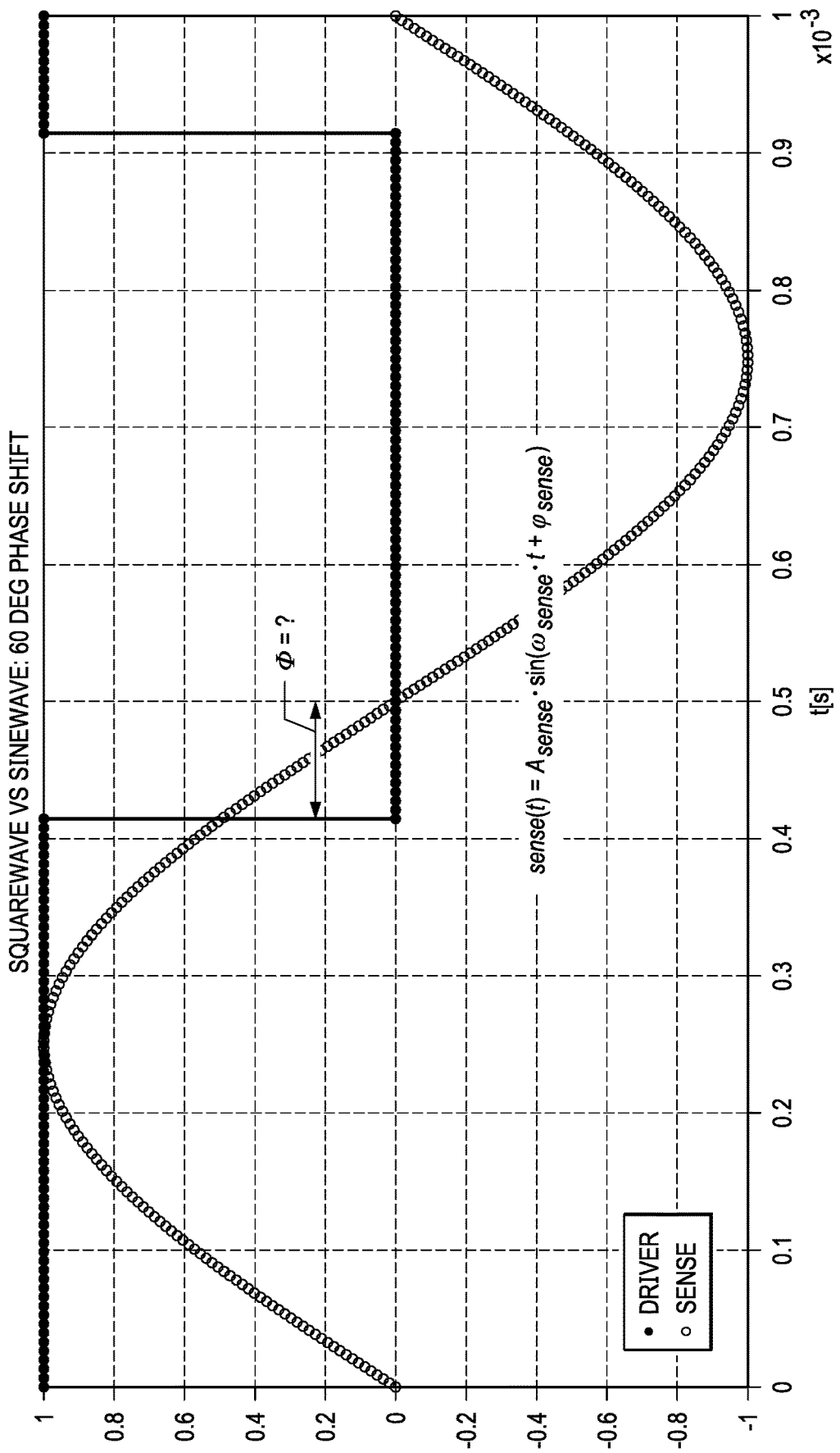
FIG. 1B is a graph showing the drive signal and sense signal of FIG. 1A and the phase shift therebetween.
Figure 1C:
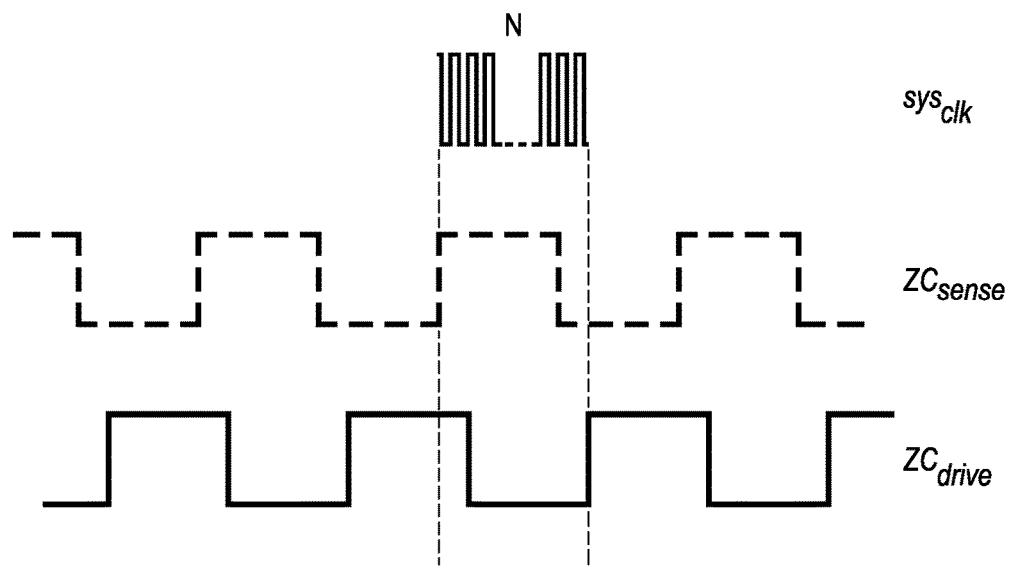
FIG. 1C is a graph used in explaining a first known technique for estimating the phase shift between the drive signal and the sense signal of FIG. 1A.
Figure 1D:
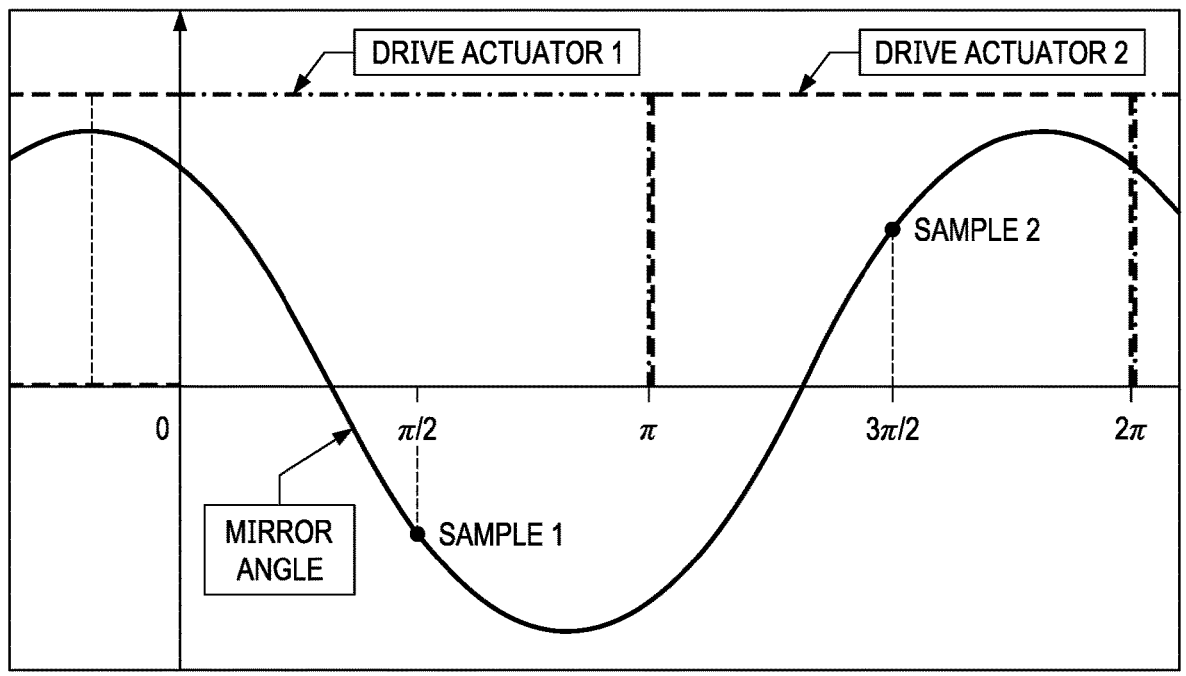
FIG. 1D is a graph used in explaining a second known technique for estimating the phase shift between the drive signal and the sense signal of FIG. 1A.
Figure 1E:
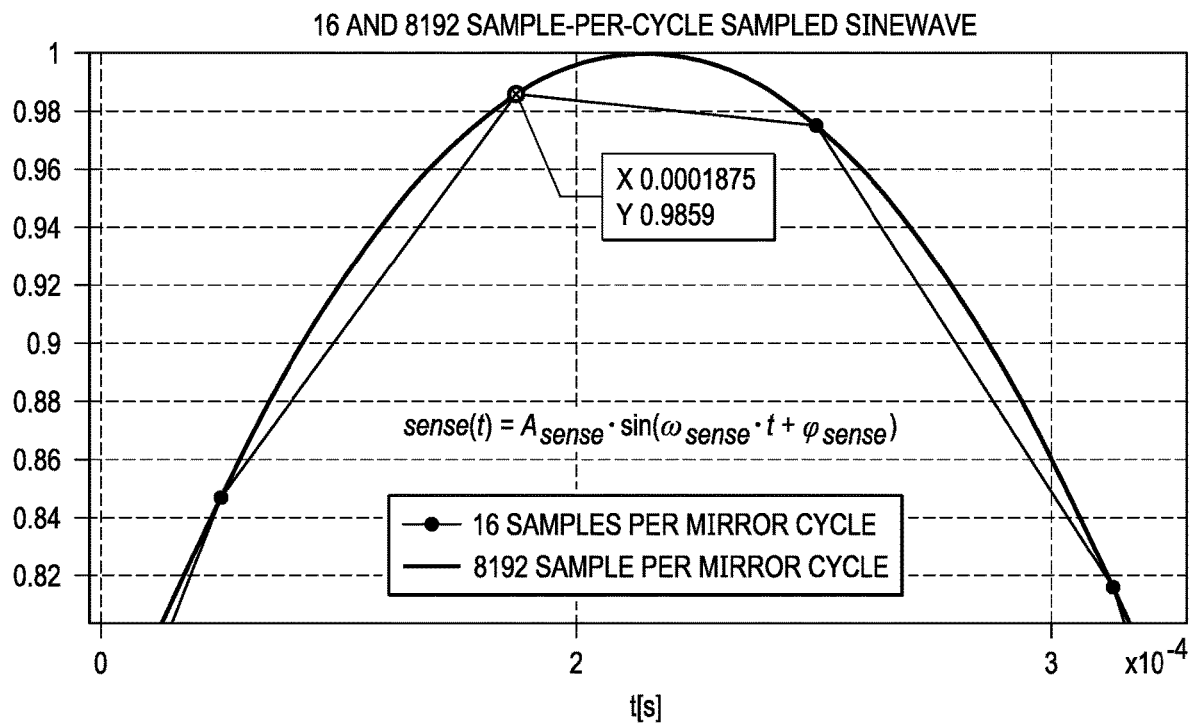
FIG. 1E is a graph used in explaining a first known technique for estimation of the amplitude of the sense signal of FIG. 1A.
Figure 1F:
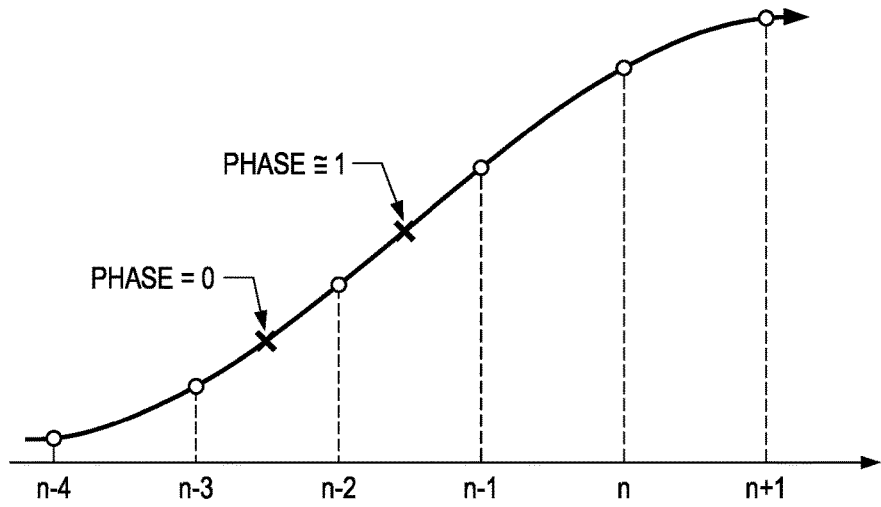
FIG. 1F is a graph used in explaining a second known technique for estimation of the amplitude of the sense signal of FIG. 1A.
Figure 2B:
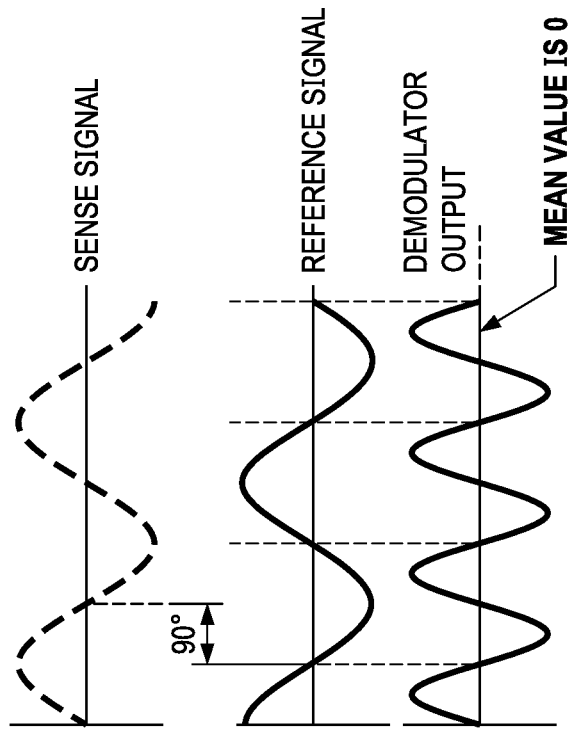
FIGS. 2A-2B are graphs used in explaining a digital lock-in amplifier approach disclosed herein for use in determining the phase shift between drive and sense signals in a resonant MEMS device.
Figure 2A:
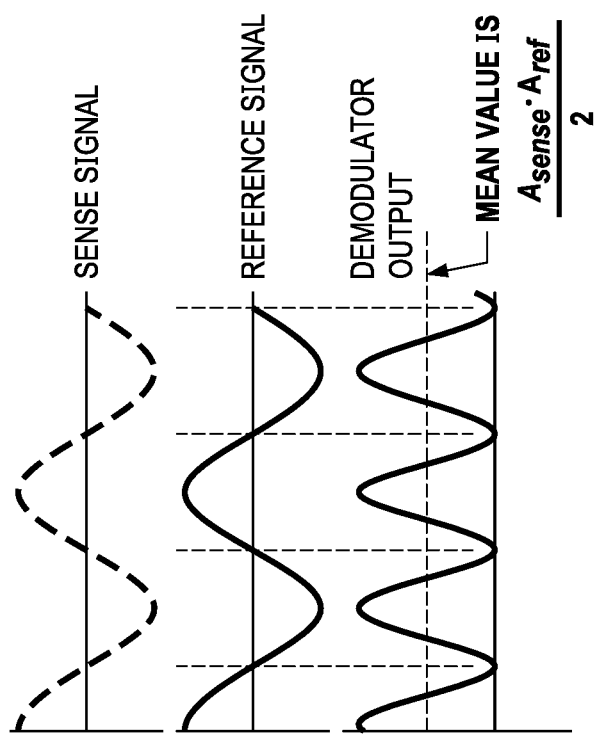

Illustrated in FIGS. 2A-2B is the digital lock-in amplifier approach. Shown in FIG. 2A are a digitized version of the sense signal as well as a reference signal, both at the same frequency. If these two signals are multiplied, the result is a signal with a mean value that is proportional to their amplitudes as well as the phase shift between the signals. Thus, notice that the result of this multiplication is equal to the two estimations (amplitude and phase of a sense signal) that it is desired to accurately and quickly perform. In the example of FIG. 2A, there is no phase shift between the sense signal and reference signal, so the mean value of the resulting wave can be calculated as:

$$\text{Mean} = \frac{A_{sense} \cdot A_{ref}}{2}$$

Turn now to the example of FIG. 2B, where the sense signal and reference signal are in phase quadrature (e.g., phase shifted by) 90°. Notice that in this example, the mean value of the product of the sense signal and reference signal is zero.

The mathematics yielding this result are now explained. The sense signal can be mathematically represented as:

$$\text{sense}(t) = A_{sense} \cdot \sin(\omega_{sense} \cdot t + \varphi_{sense})$$

Here, Asense is the amplitude of the sense signal, $\omega_{sense}$ is the frequency of the sense signal, and $\varphi_{sense}$ is the phase of the sense signal.

The reference signal can be mathematically using the following two equations:

$$\cos_{ref}(t) = A_{ref} \cdot \cos(\omega_{ref} \cdot t + \varphi_{ref})$$

$$\sin_{ref}(t) = A_{ref} \cdot \sin(\omega_{ref} \cdot t + \varphi_{ref})$$

Here, Aref is the amplitude of the reference signal, $\omega_{ref}$ is the frequency of the reference signal, and $\varphi_{ref}$ is the phase of the reference signal.

The results of multiplication of the sense signal by the reference signal yields x and y values, which can be mathematically represented as:

$$y(t) = \text{sense}(t) \cdot \cos_{ref}(t) = \frac{A_{ref} \cdot A_{sense}}{2} \cdot [\sin(\Delta\varphi) + \sin(2\omega_{ref}t + \varphi_{sense} + \varphi_{ref})]$$

$$x(t) =$$

$$\text{sense}(t) \cdot \sin_{ref}(t) = \frac{A_{ref} \cdot A_{sense}}{2} \cdot [\cos(\Delta\varphi) - \cos(2\omega_{ref}t + \varphi_{sense} + \varphi_{ref})]$$

Here, Aref is the amplitude of the reference signal, Asense is the amplitude of the sense signal, $\omega_{ref}$ is the frequency of the reference signal, $\varphi_{sense}$ is the phase of the sense signal, $\varphi_{ref}$ is the phase of the reference signal, and $\Delta\varphi$ is the difference between $\varphi_{sense}$ and $\varphi_{ref}$.

Therefore, as can be seen, the result includes expressions proportional to amplitude, as well as the phase shift, and an intermodulation product ($\omega_{ref} \cdot t$). The intermodulation product represents the oscillations seen in the product (demodulator output) shown in FIGS. 2A and 2B, and it is desired to remove these oscillations from the output.

Assuming that $\omega_{ref} = \omega_{sense}$ and that Aref=1, the average of y(t), denoted Y, as obtained using suitable low-pass filtering can be mathematically represented as:

$$Y = \langle y(t) \rangle = \frac{A_{sense}}{2} \cdot \sin(\Delta\varphi)$$

Likewise assuming that $\omega_{ref} = \omega_{sense}$ and that Aref=1, the average of x(t), denoted X, as obtained using suitable low-pass filtering can be mathematically represented as:

$$X = \langle x(t) \rangle = \frac{A_{sense}}{2} \cdot \cos(\Delta\varphi)$$

From this, using simple math, the amplitude of the sense signal can be recovered as:

$$A_{sense} = 2 \cdot \sqrt{X_2 + Y_2}$$

Similarly, the phase shift between the sense signal and reference signal can be recovered as:

$$\Delta\varphi = \tan^{-1}(Y/x)$$

Figure 3:
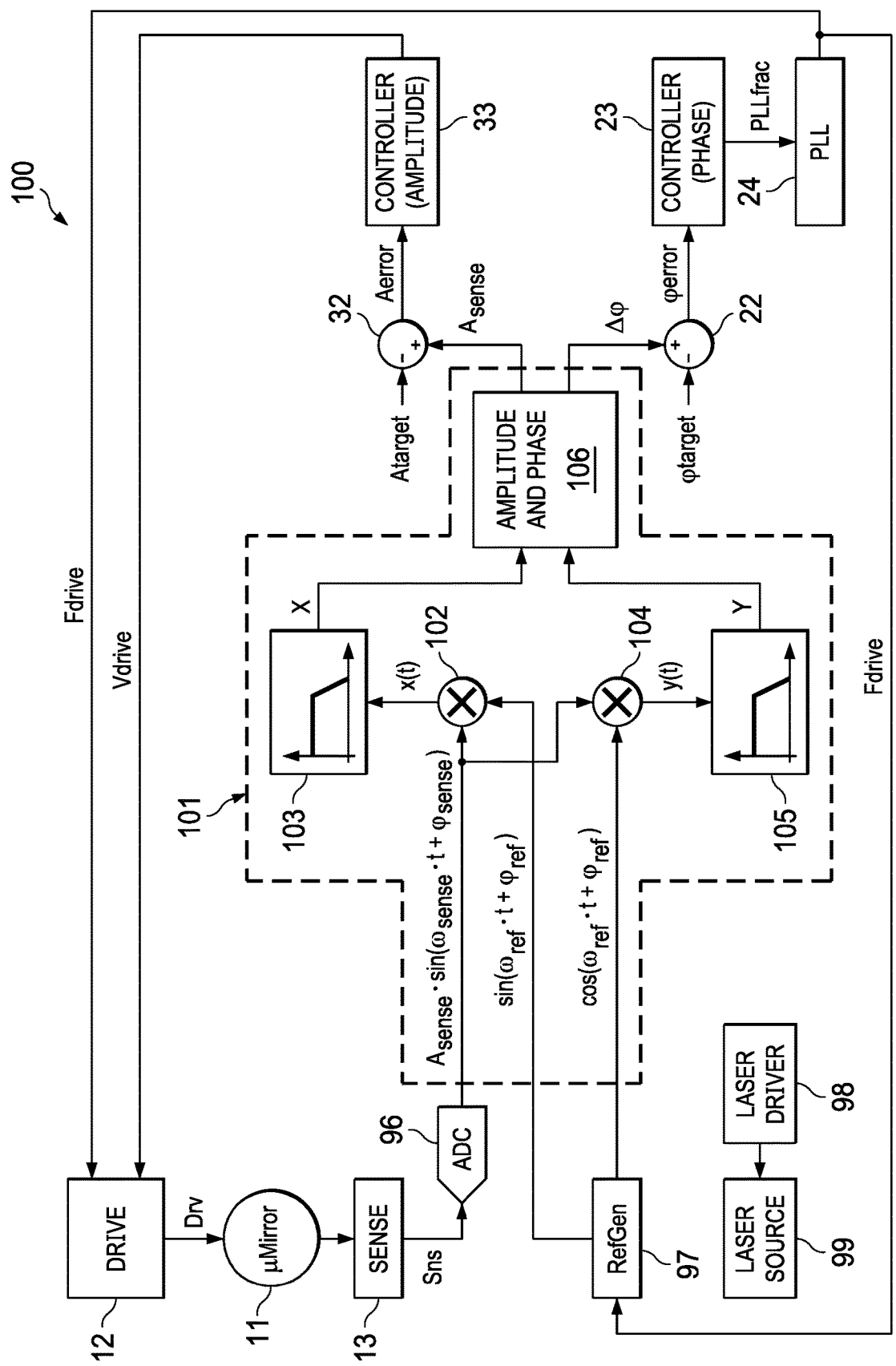
FIG. 3 is a schematic block diagram of a laser scanning projector disclosed herein utilizing computationally less intensive control loops.

Hardware for use in implementing the estimation of the phase and amplitude of the sense signal, and then using that estimation in operating a laser scanning projector 100, is now described with additional reference to FIG. 3.

The laser scanning projector 100 includes a laser source 99 operated and driven by a laser driver 98 to emit a modulated laser beam at a resonant MEMS mirror 11 (e.g., micromirror). The MEMS mirror 11 is driven at resonance by a drive signal Drv generated by drive circuitry 12. A sensor 13, such as a piezoresistive based sensor, is used to generate a sense signal Sns in response to the movements of the MEMS mirror 11. A reference generator 97 generates reference signals for use by feedback circuitry 101. The feedback circuitry 101 receives the reference signals from the reference generator 97 and the sense signal Sns as input, and from them estimates the amplitude Asense of the sense signal and the phase shift $\Delta\varphi$ of the sense signal.

A first error amplifier 22 compares the phase shift $\Delta\varphi$ to a target phase shift φtarget to determine a phase error φerror. A phase controller 23 generates a new frequency setpoint to be used for tuning the driving frequency which may be generated from a fractional phase locked loop 24, in which case such tuning is achieved by changing the fractional input (PLLfrac). It is understood anyway that even though PLL circuitry is referred to herein, the driving frequency could also be generated by any controllable oscillator (such as a Voltage-Controlled Oscillator VCO).

The reference generator 97 receives the frequency signal Fdrive from the PLL 24 so that the frequency of the reference signals generated by the reference generator 97 matches the frequency of the drive signal Drv.

A second error amplifier 32 compares the amplitude Asense to an amplitude target Atarget to determine an amplitude error Aerror. An amplitude controller 33 generates a voltage signal Vdrive instruction the drive circuitry 12 at what amplitude to generate the drive signal Drv.

An analog to digital converter (ADC) 96 digitizes the sense signal Sns. The feedback circuitry 101 includes a first multiplication circuit 102 (e.g., a modulator) that receives the digitized sense signal Sns, which is mathematically represented as $$\text{sense}(t) = A_{sense} \cdot \sin(\omega_{sense} \cdot t + \varphi_{sense})$$

Here, with sense(t) and below with the following equations and expressions, since the operations are performed in the digital domain, t=nT, with T being the sampling period and n being the index of the nth sample. The first multiplication circuit 102 also receives a digital reference sine wave from the reference generator 97, which is mathematically represented as:

$$y_{ref} = \sin(\omega_{ref} t + \varphi_{ref})$$

The first multiplication circuit 12 multiplies these two signals to yield:

$$x(t) = \text{sense}(t) \cdot \sin_{ref}(t) = \frac{1 \cdot A_{sense}}{2} \cdot [\cos(\Delta\varphi) - \cos(2\omega_{ref} t + \varphi_{sense} + \varphi_{ref})]$$

The expression x(t) is filtered by low-pass filter 103 within the feedback circuit 101 to produce X, mathematically represented as:

$$X = \langle x(t) \rangle = \frac{A_{sense}}{2} \cdot \cos(\Delta\varphi)$$

The feedback circuit 101 includes a second multiplication circuit 104 (e.g., a modulator) that receives the digitized sense signal sense(t), and also receives a digital reference cosine wave, the reference cosine wave being mathematically represented as:

$$x_{ref} = \cos(\omega_{ref} t + \varphi_{ref})$$

The second multiplication circuit 104 multiplies these two signals to yield:

$$y(t) = \text{sense}(t) \cdot \cos_{ref}(t) = \frac{1 \cdot A_{sense}}{2} \cdot [\sin(\Delta\varphi) + \sin(2\omega_{ref} t + \varphi_{sense} + \varphi_{ref})]$$

The expression y(t) is filtered by low-pass filter 105 within the feedback circuit 101 to produce Y, mathematically represented as:

$$Y = \langle y(t) \rangle = \frac{A_{sense}}{2} \cdot \sin(\Delta\varphi)$$

X and Y are passed to an amplitude and phase estimation block 106 within the feedback circuit 101. The amplitude and phase estimation block 106 calculates the amplitude Asense and phase $\Delta\varphi$ of the sense signal sense(t) as:

$$A_{sense} = 2 \cdot \sqrt{X^2 + Y^2}$$

$$\Delta\varphi = \tan^{-1}(Y/X)$$

Figure 4:
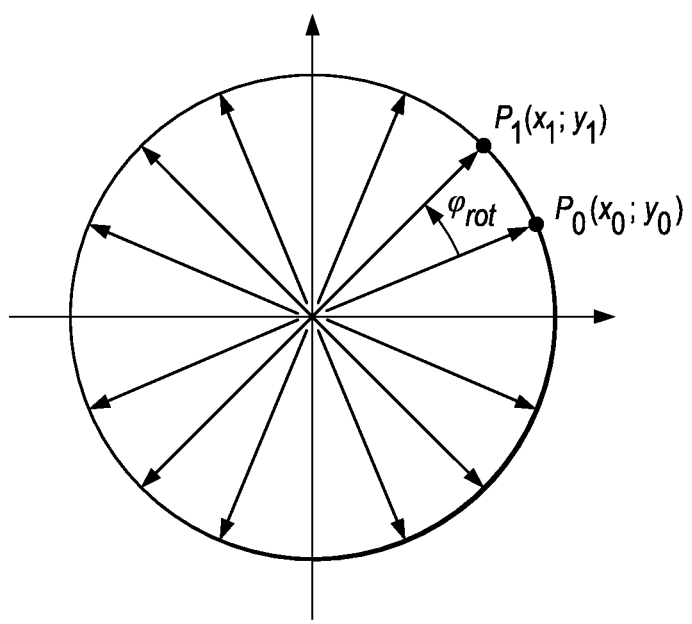
FIG. 4 is a trigonometric circle used in explaining the generation of the reference cosine and sine waves by the reference generator of FIG. 3.

Generation of the reference signals $x_{ref}$ and $y_{ref}$ by the reference generator 97 is now described with initial reference to FIG. 4. Typically, when sinusoidal signals are generated, a summation approximation, such as the Taylor Series, may be used. However, these approximations are not precise enough for use in performing the techniques described herein. Furthermore, producing these approximations utilizes excessive processing power, which is particularly detrimental for applications where more limited processing capabilities are available. Indeed, using the Taylor series or polynomial approximations has too many drawbacks. As such, a new method for generating sinusoidal signals for use as reference signals has been developed. The new method relies upon trigonometric relationships to yield accurate results without the use of approximation, and precision being the function of fixed point implementations (e.g., no algorithmic error is introduced).

Referring to FIG. 4, a sine wave over time is depicted on a trigonometric circle. Starting from a generic point, here $P_0$, there is an initial reference phase $\varphi_{ref}$ with respect to the x-axis, this initial phase being a use-defined entry such that this initial reference phase is chosen to suit the present application. Then, in the next iteration, there is point $P_1$, then point $P_2$, and so on, accomplished using a rotation of the vector. A rotation can be performed using trigonometric relationships, knowing the amount of rotation to be performed and the actual phase values at the current step. For example, assume there will be 16 samples of the sense signal Sns per mirror cycle, meaning that the output data rate (ODR) is 16, and that 16 data points for a reference sine wave are therefore to be generated so that the conditions of $\omega_{ref} = \omega_{sense}$ and $A_{ref} = 1$ are fulfilled, enabling the calculation of x(t) and y(t) as described above to be performed.

The amount of rotation to be performed at each step can be calculated as:

$$\varphi_{rot} = 360°/ODR = 360°/16 = 22.5°$$

Therefore, knowing the amount of rotation per step and the initial phase-point $P_0$ calculated as:

$$P_0(x_0; y_0),$$

where $x_0 = \cos(\varphi_{ref})$, $y_0 = \sin(\varphi_{ref})$

This allows the calculation of the phase shift at each rotation and its use to calculate the sine and cosine waves as:

$$\varphi_{i+1} = \varphi_i + \Delta\varphi \rightarrow \begin{cases} \cos(\varphi_{i+1}) = \cos(\varphi_i) \cdot \cos(\varphi_{rot}) - \sin(\varphi_i) \cdot \sin(\varphi_{rot}) \\ \sin(\varphi_{i+1}) = \cos(\varphi_i) \cdot \sin(\varphi_{rot}) + \sin(\varphi_i) \cdot \cos(\varphi_{rot}) \end{cases},$$

with i=0, . . . , ODR−1.

Figure 5:
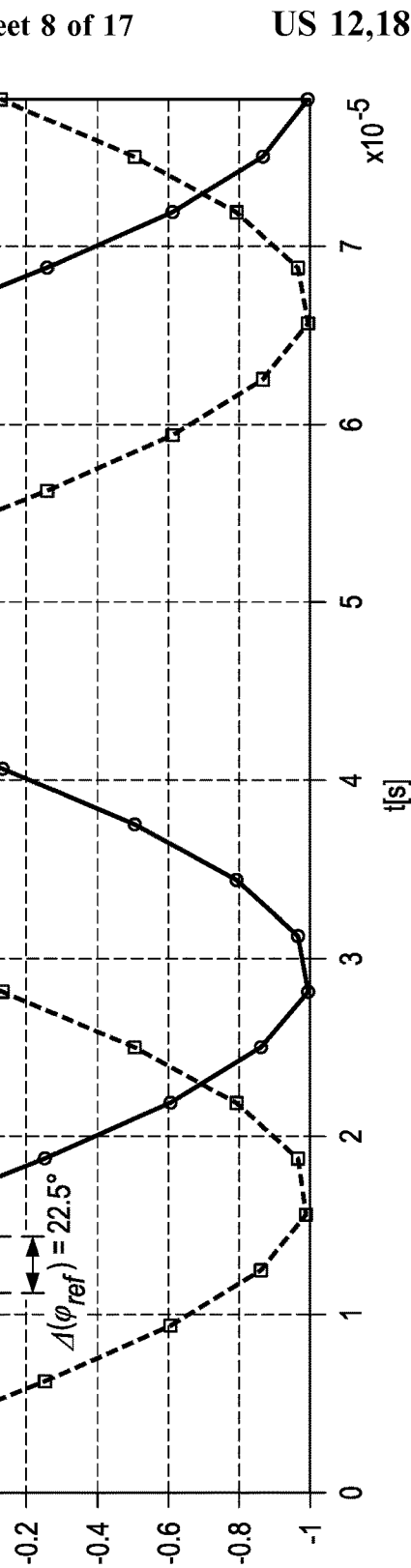
FIG. 5 is a graph showing the generated reference sine and cosine waves as generated using the technique described with reference to FIG. 4.

It is to be understood that $\cos(\varphi_{rot}) = x_{rot}$ and $\sin(\varphi_{rot}) = y_{rot}$, keeping in mind that $\varphi_{rot}$ is known as being $\varphi_{rot} = 360°/ODR$, with ODR being 16 in this example. Therefore, using the known values of $\cos(\varphi_{rot})$ and $\sin(\varphi_{rot})$, and the known initial point $P_0(x_0; y_0)$, the data points used to form the sine and cosine waves shown in FIG. 5 can be determined. The advantage of this technique is that the generation of sine and cosine wave is performed without approximations and is performed simply (i.e. using only multiplicative terms which are already precalculated as xrot, yrot and the $(x_0; y_0) = (\cos(\varphi_{ref}); \sin(\varphi_{ref}))$. Therefore, the values of the reference cosine wave $x_{ref}$ and reference sine wave $y_{ref}$ as used by the multiplication circuits 102 and 104 described above, have been determined through this technique, using simple and computationally un-intensive trigonometry, allowing the performance of the estimation techniques discussed above by fixed-point calculation hardware that does not consume much area. Stated another way, using this technique to calculate the values of the reference cosine wave and reference sine wave, the physical area of the circuitry required to generate the reference cosine and sine waves is reduced as compared to the prior art.

Additionally, the precision of this technique for calculating the values of the reference sine and cosine waves is high. Consider that if the output data rate ODR were to be infinite, there would be an infinite number of values produced for the reference cosine and sine waves, and therefore such waves would precisely mathematically match actual-continuous waves. On the other hand, if a prior art technique such as the Taylor series were to be used, such precision could never be achieved, as Taylor series always produces an approximation.

Figure 6:
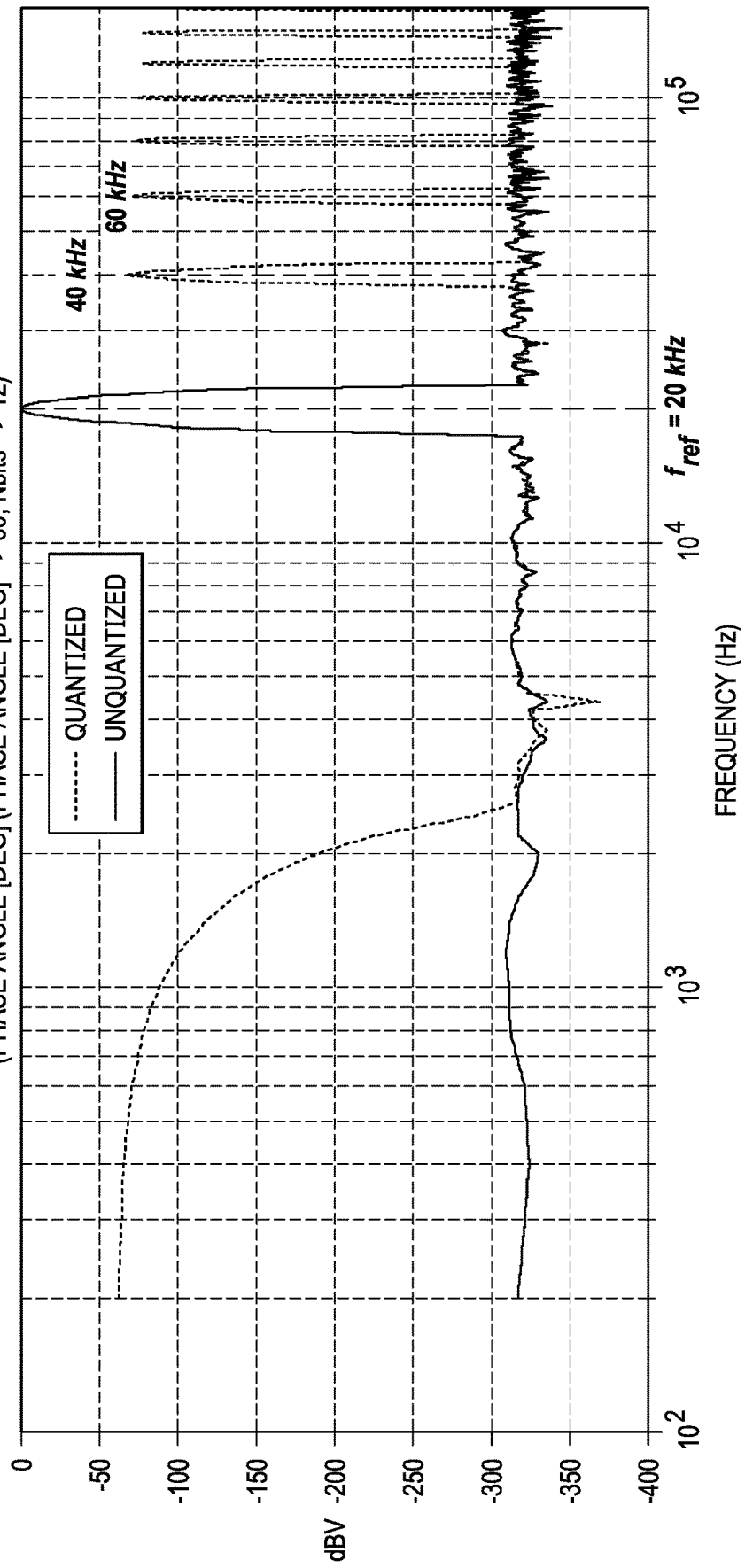
FIG. 6 is a graph showing the spectra of the generated reference sine wave.

The spectrum of the generated reference sine wave may be observed in FIG. 6. Here, the frequency of the drive signal Drv (shown as Fref) is 20 kHz, and therefore the frequency of the reference sine wave is 20 kHz. However, harmonics occur due to the quantization of the reference sine wave, with the amplitude of the harmonics being dependent upon the number of bits available for the calculations The effect of these harmonics and how to handle them will be explained in detail later herein.

Shown in FIG. 7 is a comparison of the output of the low-pass filters 103 and 105 when using sinusoidal reference waves as compared to square or triangular reference waves for the case of ODR being 16, as well as for the case of ODR being 160. The theoretical scaling factor for the reference sine wave is Aref/2, for the square wave is 2·Aref/π, and for the triangular wave is 2·Aref/π². As can be observed in FIG. 7, with a low sampling frequency (e.g., ODR=16), both the square wave and the triangular wave cannot be perfectly reproduced because they are not band-limited. As such, in the digital domain, all the infinite harmonics within the bandwidth cannot be included due to the Nyquist limit. Sine waves, on the other hand, are band-limited and so can be perfectly reproduced even when low sampling frequencies are available. The result of using either square or triangular wave as reference instead of sinusoids is that the scaling factor would be different than its theoretical value, with this effect being even more pronounced for the square wave since the harmonics decrease as 1/n for the square wave but 1/n² for the triangular wave. This would ultimately lead to increased error in the estimation of the phase shift and amplitude of the sense signal Sns. Furthermore, if a square wave or triangular wave were used as the reference wave, harmonics carried by the sense signal Sns would also be demodulated, adding more information to the output that is not information about the fundamental components of the sense signal Sns. As such, the generation of reference sinusoidal waves is used herein.

Estimation of the phase Δφ by the feedback circuitry 101 is now described. As a reminder, the sense signal Sns can be mathematically represented as:

$$\text{sense}(t) = A_{sense} \cdot \sin(\omega_{sense} \cdot t + \varphi_{sense}) + OS_{sense}$$

Here, $OS_{sense}$ is the offset that might appear as an additive term in the sense signal Sns.

As explained above, the generation of the reference cosine and sine reference signals undesirably includes harmonics due to both quantization and limited ODR. As a result, for example, the cosine reference signal can be mathematically represented as:

$$\cos_{ref}(t) = \cos(\omega_{ref} t + \varphi_{ref}) + A'\text{ref} \cdot \cos(2\omega_{ref} t + \varphi'_{ref}) + \ldots$$

Here, the $A'\text{ref} \cdot \cos(2\omega_{ref} t + \varphi'_{ref})$ term and those following represent the harmonics present due to quantization. The calculation of y(t) then yields:

$$y(t) = \text{sense}(t) \cdot \cos_{ref}(t) = \frac{A_{sense}}{2} \cdot [\sin(\Delta\varphi) + \sin(2\omega_{ref} t + \varphi_{sense} + \varphi_{ref})] +$$
$$\frac{A'_{ref} \cdot A_{sense}}{2} \cdot [\sin(3\omega_{ref} t + \varphi_{sense} + \varphi'_{ref}) + \sin(\omega_{ref} t + \varphi_{sense} + \varphi'_{ref})] +$$
$$\ldots + \frac{OS_{sense}}{2} \cdot \cos(\omega_{ref} t + \varphi_{ref}) +$$

This yields the desired fundamental components of the sense signal Sns, namely the $$\frac{A_{ref}}{2}$$

and sin(Δφ) terms, but also undesired intermodulation products (the other terms) that arise due to the difference between $\omega_{sense}$ and $\omega_{ref}$, $2\omega_{ref}$, etc.

Similarly, the sine reference signal can be mathematically represented as:

$$\sin_{ref}(t) = \sin(\omega_{ref} t + \varphi_{ref}) + A'\text{ref} \cdot \sin(\omega_{ref} t + \varphi'_{ref}) + \ldots$$

The calculation of x(t) then yields:

$$x(t) = \text{sense}(t) \cdot \sin_{ref}(t) = \frac{A_{sense}}{2} \cdot [\cos(\Delta\varphi) - \cos(2\omega_{ref} t + \varphi_{sense} + \varphi_{ref})] +$$
$$\frac{A'_{ref} \cdot A_{sense}}{2} \cdot [-\cos(3\omega_{ref} t + \varphi_{sense} + \varphi'_{ref}) + \cos(\omega_{ref} t + \varphi_{sense} + \varphi'_{ref})] +$$
$$\ldots + \frac{OS_{sense}}{2} \cdot \sin(\omega_{ref} t + \varphi_{ref}) + \ldots$$

Here too, this yields the desired fundamental components of the sense signal Sns, namely the $$\frac{A_{ref}}{2}$$

and cos(Δφ) terms, but also undesired intermodulation products (the other terms) that arise due to the difference between $\omega_{sense}$ and $\omega_{ref}$, $2\omega_{ref}$, etc.

Figure 8:
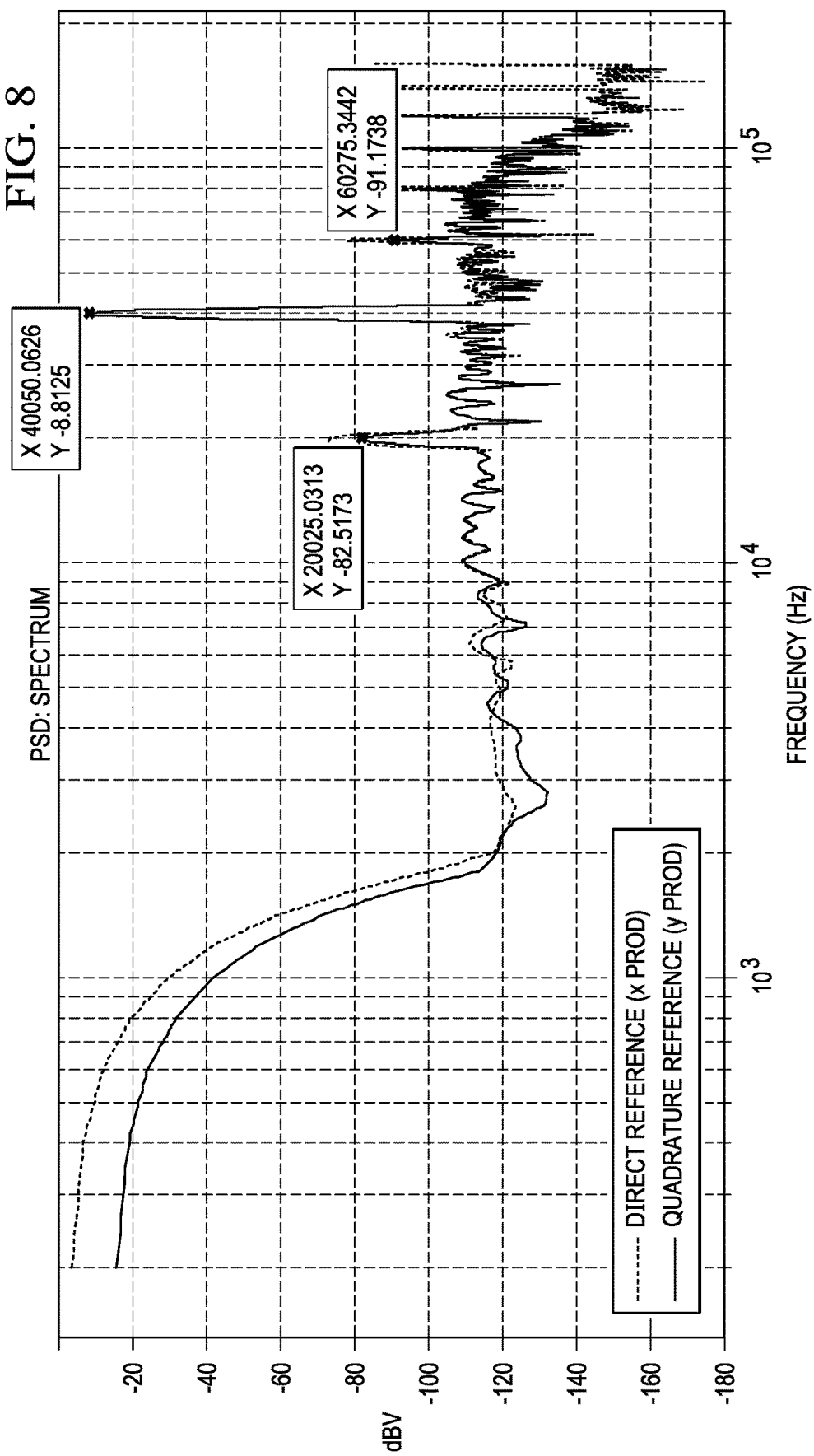
FIG. 8 is a graph showing the frequency response of the signal x(t) generated by the first demodulator of FIG. 3.
Figure 9:
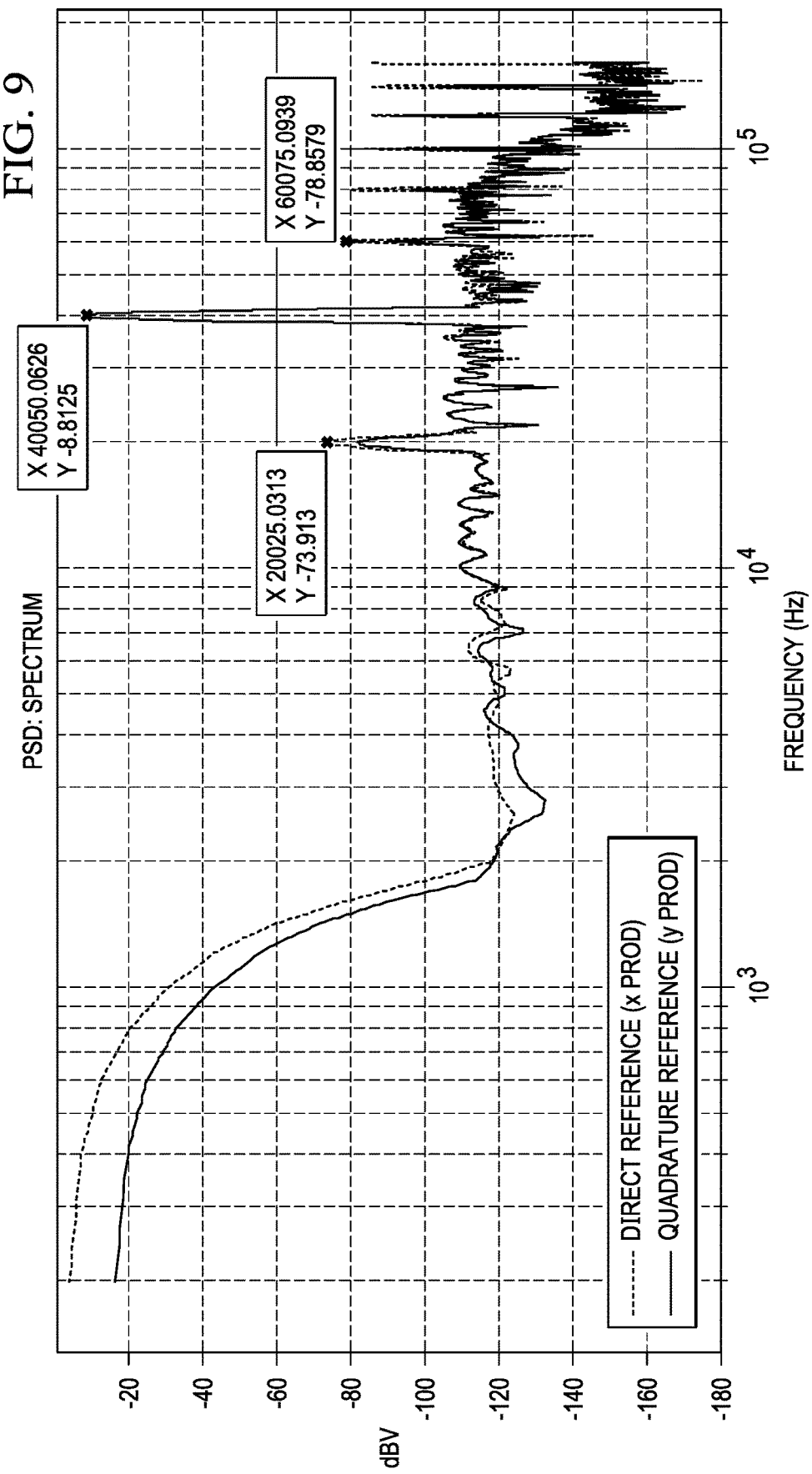
FIG. 9 is a graph showing the frequency response of the signal x(t) generated by the second demodulator of FIG. 3.

The results of the multiplications may be seen for the sample of the cosine reference wave in FIG. 8, where the desired data (that is the DC component) can be observed together with the intermodulation products (starting shortly before a frequency of $10^4$ Hz), and for the sample of the sine reference wave in FIG. 9, wherein the desired data (again, the DC component) can be observed together with the intermodulation products (also starting shortly before a frequency of $10^4$ Hz).

It is desired to cancel out these resulting intermodulation components in x(t) and (y). To do this, the low-pass filters 103 and 105 should have zeroes at harmonics in the reference signals, as shown in FIG. 10, to thereby filter out the intermodulation components. Since the reference sine and cosine signals are internally generated, their spectrum is known, and therefore the proper placement of the zeroes can easily be determined. For example, the zeroes are placed at $\omega_{ref}$, $2\omega_{ref}$, $3\omega_{ref}$, etc., because those are the expected location of the harmonics given that $\omega_{ref}$ is known. The filters 103 and 105 may therefore be suitable ODR-decimation SINC filters.

The inputs x(t) and y(t) to the filters 103 and 105 can be observed in FIG. 11A, and the outputs of X and Y can be observed in FIG. 11B. After filtering, X thus becomes:

$$X = \langle x(t) \rangle = \frac{A_{sense}}{2} \cdot \cos(\Delta\varphi)$$

After filtering, Y thus becomes:

$$Y = \langle y(t) \rangle = \frac{A_{sense}}{2} \cdot \sin(\Delta\varphi)$$

From X and Y, Asense and $\Delta\varphi$ can be recovered. This could be performed mathematically in the digital domain as:

$$A_{sense} = 2 \cdot \sqrt{X^2 + Y^2}; \text{ and}$$

$$\Delta\varphi = \tan^{-1}(Y/X)$$

This would be easily performable in the case where the amplitude and phase estimation block 106 are implemented in a microprocessor. However, consider the case where the amplitude and phase estimation block 106 is to be implemented in a small application specific integrated circuit (ASIC) with low-power consumption and small area constraints, with poor computational abilities. In such a case, the above calculations of Asense and $\Delta\varphi$ cannot be easily performed without modifying the constraints of the ASIC.

The implementation of the functions of the amplitude and phase estimation block 106 utilizing techniques easily performable by a small ASIC with low-power consumption and small area constraints is now described.

Consider the COordinate Rotation DIgital Computer (CORDIC) technique, a simple and efficient technique that can be used to calculate trigonometric functions, hyperbolic functions, square roots, multiplications, divisions, exponentials, and logarithms, using only computationally un-intensive subtraction and shift operations of the implementing ASIC. The starting point for the application of CORDIC to amplitude and phase estimation is the rotation matrix M, which is mathematically equivalent to X and Y described above, and can be represented as:

$$M = \begin{bmatrix} \cos(\Delta\varphi) & -\sin(\Delta\varphi) \\ \sin(\Delta\varphi) & \cos(\Delta\varphi) \end{bmatrix}$$

Starting from the rotation matrix M, factorization by $\cos(\Delta\varphi)$ can be performed to yield:

$$M = \cos(\Delta\varphi) \begin{bmatrix} 1 & -\tan(\Delta\varphi) \\ \tan(\Delta\varphi) & 1 \end{bmatrix}$$

The idea is to achieve $\Delta\varphi$ through successive approximations obtained by a linear combination of N precalculated angles $\theta_i$, with the angles $\theta_i$ being chosen such that their tangent values are powers of 2, such that $\tan(\theta_i) = 2^{-i}$. This reduces the matrix to a form where iterations can be calculated using shifts rather than multiplications.

Through this technique, $\Delta\varphi$ is ultimately computed as:

$$\Delta\varphi \cong \sum_{i=0}^{N-1} \sigma_i \theta_i,$$

where $\sigma_i$ is +1 or −1 depending upon the sign of the $y_{i-1}$ component of the rotation vector at the previous iteration.

This would work well if:

$$\Delta\varphi \in \left[-\frac{\pi}{2}, \frac{\pi}{2}\right]$$

However, for a 4-quadrant application, modifications are to be made.

Figure 12A:
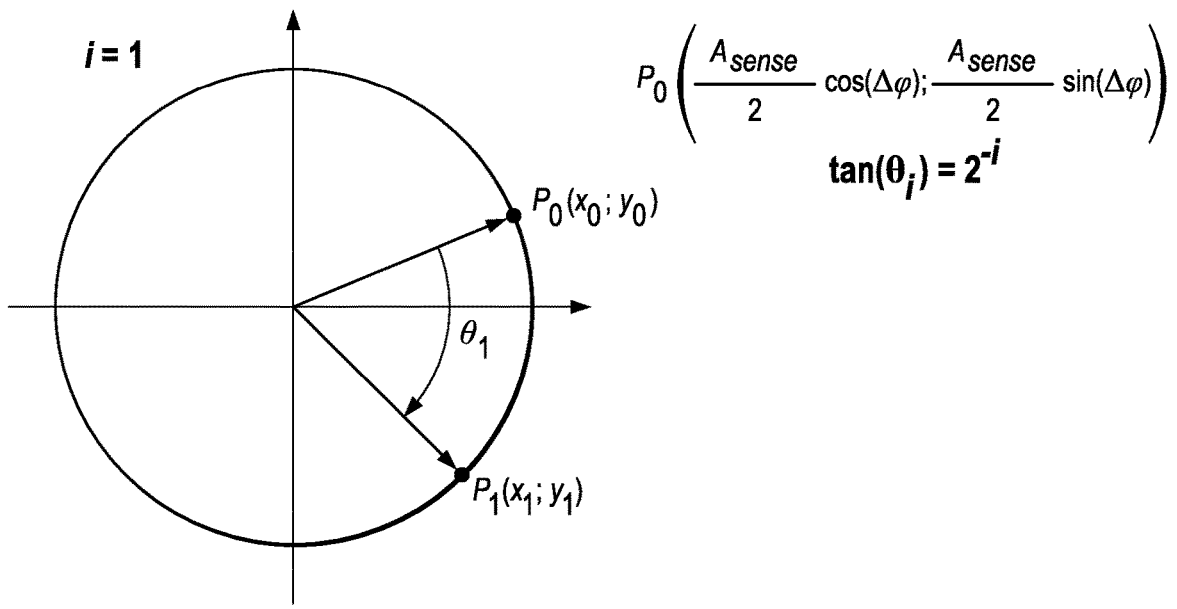
FIGS. 12A-12D are trigonometric circles used to describe the CORDIC technique used to recover the phase shift and amplitude values from the outputs X and Y of the filters of FIG. 3.

Refer now to the trigonometric circle shown in FIG. 12A, where a first point or vector $P_0$ having the cosine, sine coordinates of $(x_0, y_0)$ is shown, as is a second point or vector $P_1$ having the cosine, sine coordinates of $(x_1, y_1)$ is shown. These points are the output of the filters 103 and 105 at the beginning and after the first CORDIC iteration respectively-note that $P_0$ is therefore calculated as $$\left[\frac{A_{sense}}{2}\cos(\Delta\varphi), \frac{A_{sense}}{2}\sin(\Delta\varphi)\right].$$

The angular distance between the vector $P_0$ and the x-axis is the $\Delta\varphi$ that it is desired to recover.

Figure 12B:
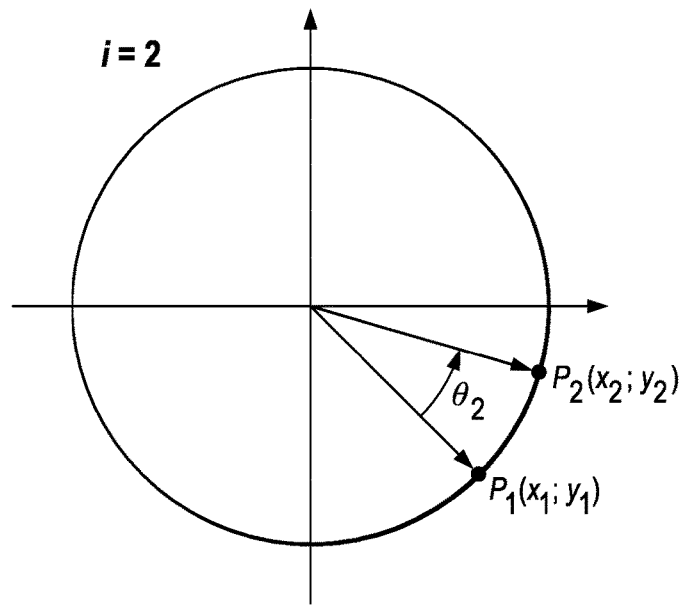
Figure 12C:
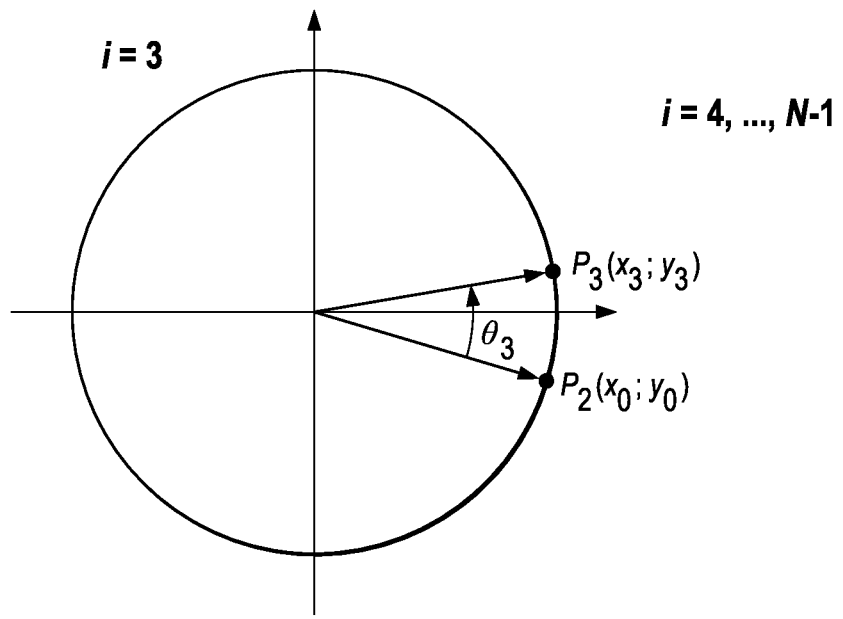
Figure 12D:
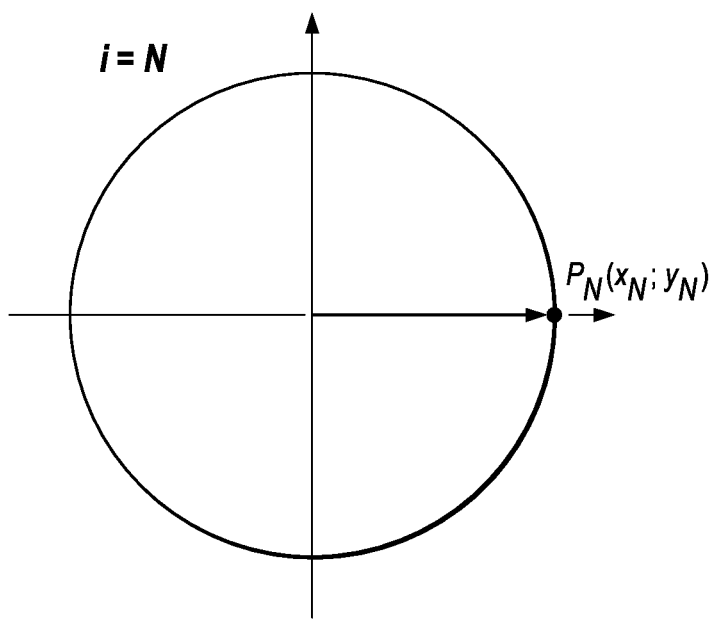

This is performed by successive approximation using the rotation matrix M. For example, for iteration i=1, $P_0$ can be rotated by $\theta_1$ to reach $P_1$, as shown in FIG. 12A. For the next iteration, i=2, $P_1$ can be rotated by $\theta_2$ to reach $P_2$, having the cosine, sine coordinates of $(x_2, y_2)$, as shown in FIG. 12B. For the next iteration, i=3, $P_2$ can be rotated by $\theta_3$ to reach $P_3$, having the cosine, sine coordinates of $(x_3, y_3)$, as shown in FIG. 12C. For the Nth and last iteration, i=N, $P_N$ is on the x-axis and has coordinates of (xn, 0).

This has been a series of approximated rotations by $\pm\theta_i$, $\pm\theta_{i+1}, \pm\theta_{i+2}, \pm\theta_{i+3}$, etc (with the actual signs of each rotation depending on the starting point as well as being decided at each iteration), up until the last point which will have approximately a 0 phase with an accuracy that depends on the number of iterations N (algorithmic error) and the fixed-point implementation. If these rotations are summed, the result will be a composition of angles that yield $\Delta\varphi$.

Thus, the technique has started with a vector that is $\Delta\varphi$ degrees away from the x-axis, and at each iteration ($\pm\theta_i$, $\pm\theta_{i+1}, \pm\theta_{i+2}, \pm\theta_{i+3}$, etc), the resulting phase becomes closer to 0. Thus, $\Delta\varphi$ is approximated by summation of $\sigma_i \theta_i$ from 0 to N−1, with $\sigma_i$ being +1 or −1 dependent upon the $y_{i-1}$ component of the rotation vector at the previous iteration, and with $\theta_i$ being the rotation angle at each iteration. So, $\theta_i$ is the angle whose tangent is $2^{-i}$. Thus, $\Delta\varphi$ is recomposed by as the series of smaller angles that when combined together with the appropriate sign, with the rotations being performed with the tangents of those angles, which are powers of 2 as explained. Therefore, this becomes multiplications by powers of 2, which are implemented as shifts, and shifts as explained above are efficient in terms of computational complexity and are capable of being performed by simple ASICS.

The successive approximation can be summed up as follows:

1. The starting point is the X, Y coordinates from the outputs of the filters 103 and 105, mathematically represented as $$\left[\frac{A_{sense}}{2}\cos(\Delta\varphi), \frac{A_{sense}}{2}\sin(\Delta\varphi)\right],$$

as explained above

2. If X>=0, set $\Delta\theta$=0 and go to the next step. Instead, If X<0, then if Y>0 set $\Delta\theta$=+180, else set $\Delta\theta$=−180. Also, rotate the starting X, Y coordinates by 180° by setting X=−X and Y=−Y.

3. Start from $\Delta\theta_i$ from step 2., and repeat from i=0 to N−1:

$$\text{If } Y \leq 0, \begin{cases} X = X - (Y \gg i) \\ Y = Y + (X \gg i) \\ \Delta\theta = \Delta\theta - \theta_i \end{cases}$$

$$\text{If } Y > 0, \begin{cases} X = X + (Y \gg i) \\ Y = Y - (X \gg i) \\ \Delta\theta = \Delta\theta + \theta_i \end{cases}$$

The phase contributions of the partial angles $\Delta\theta$ are recorded in a lookup table. The lookup table is used together with the starting point X, Y and the described operations are performed at each iteration. After an infinite number of iterations, the phase will be exactly at 0. It has been found that 12 to 18 iterations provide sufficient accuracy for the laser scanning projector 100.

After the last iteration, $\Delta\varphi$ and $A_{sense}$ are determined as:
$\Delta\varphi \approx \Delta\theta$,
$A_{sense} = K \cdot X$, where K depends on N and is known a priori as: $2 \cdot \Pi_{i=0}^{N-1} \cos(\theta_i)$.

Using the above techniques, because the phase and amplitude (which is indicative of the opening angle of the MEMS mirror) are known upon commencement of operation, proper settings for Fdrive and Vdrive are quickly determined, making calibration quick and easy. Thus, in addition to reducing the computational complexity utilized for proper control of the MEMS mirror 11, lock time is decreased due to the quick determination of proper settings for Fdrive and Vdrive. Moreover, the amplitude and phase estimation are run in parallel and so are both control loops. Additionally, since the phase estimation is not limited by the resolution of the PLL counts, the above techniques are usable even with mirrors having a high resonance frequency, and in fact, are usable with any resonance MEMS device and are not limited to MEMS mirrors. Still further, the stability of the output provided here is more stable than would be provided by any analog control because analog lock-in amplifiers, though still implemented, suffer from technological and physical limitations (e.g., temperature deviation from the transistors used for demodulation, non-linearities, etc) which digital implementations are insensitive to. In addition the reference signal generation is reliable as it is based on using the same clock source as other components within the device.

The described functions and blocks of the feedback circuit 101 may be performed by a field programmable gate array (FPGA) or application specific integrated circuit (ASIC), for example.

Note that the above scheme permits precise control of the MEMS mirror 11 through the described hardware performing the described functions, and that the above scheme reduces the computational resources utilized to obtain precise control of the MEMS mirror 11 (e.g., reduces computational intensity of the functions performed that are used to precisely control the MEMS mirror 11).

Finally, it is clear that modifications and variations may be made to what has been described and illustrated herein, without thereby departing from the scope of this disclosure, as defined in the annexed claims.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. A method of operating a micro-electro mechanical systems (MEMS) device, comprising:
   driving the MEMS device with a drive signal;
   sensing movement of the MEMS device caused by the drive signal, and generating a sense signal indicative of the movement;
   using a rotation-matrix approach to generate a reference cosine wave and a reference sine wave, the reference cosine wave and reference sine wave each having an amplitude of 1 and a same frequency as that of the sense signal;
   multiplying the sense signal by the reference sine wave to produce a first product;
   multiplying the sense signal by the reference cosine wave to produce a second product;
   low-pass filtering the first product to produce a first intermediate output;
   low-pass filtering the second product to produce a second intermediate output;
   performing a 4-quadrant CORDIC technique on the first and second intermediate outputs to thereby determine a phase shift between the sense signal and the drive signal as well as an amplitude of the sense signal;
   comparing the phase shift to a target phase shift to produce a phase error as a difference therebetween;
   comparing the amplitude of the sense signal to a target amplitude to thereby produce an amplitude error as a difference therebetween; and
   modifying the drive signal based upon the phase error and the amplitude error so that the phase error and amplitude error are eliminated by:
      generating a control signal based upon the phase error;
      generating the frequency drive signal based upon the control signal, and modifying phase of the drive signal based upon the frequency drive signal such that the phase error is eliminated; and
      generating a voltage drive signal to the driver based upon the amplitude error, and modifying amplitude of the drive signal based upon the voltage drive signal such that the amplitude error is eliminated.

2. The method of claim 1, further comprising digitizing the sense signal prior to multiplication by the reference sine and cosine waves; and wherein the reference sine and cosine waves are generated in digital form.

3. The method of claim 1, wherein the low-pass filtering of the first product serves to remove intermodulation components from the reference sine wave; and wherein the low-pass filtering of the second product serves to remove intermodulation components from the reference cosine wave.

4. The method of claim 1, wherein the low-pass filtering of the first product is performed using a first decimation SINC filter; and wherein the low-pass filtering of the second product is performed using a second decimation SINC filter.

5. The method of claim 1, wherein performing the 4-quadrant CORDIC technique comprises:
   a) defining an index i having integer values ranging from 0 to N−1, with N being the total amount of CORDIC iterations;
   b) precalculating N angles $\theta_i$ such that for each of the N angles, $\tan(\theta_i) = 2^{-i}$;
   c) determining a starting coordinate set $X_0$, $Y_0$ from the two SINC outputs (i.e. Y and X);

d) If X>=0, setting Δθ=0 as a starting point, else if X<0, then if Y>0 setting Δθ=+180, else setting Δθ=−180, and rotating the starting X, Y coordinates by 180° by setting X=−X and Y=−Y;

e) for a first number i=0 in the index, setting a next coordinate set $X_1, Y_1$ to be such that $X_1=X_0-(Y_0>>0)$ and $Y_1=Y_0+(X_0>>0)$ and determine a phase Δθ=Δθ−$θ_i$ if $Y_0 \leq 0$, but setting the next coordinate set $X_1, Y_1$ to be such that $X_1=X_0+(Y_0>>0)$ and $Y_1=Y_0-(X_0>>0)$ and determine the phase Δθ=Δθ+$θ_i$, if $Y_0>0$;

f) incrementing i by one;

g) for an ith number i in the index, setting a next coordinate set Xi, Yi to be such that $X_{i+1}=X_i-(Y_i>>i)$ and $Y_{i+1}=Y_i+(X_i>>i)$ and determine a phase Δθ=Δθ−$θ_i$ if $Y_i \leq 0$, but setting the next coordinate set $X_{i+1}, Y_{i+1}$ to be such that $X_{i+1}=X_i+(Y_i>>i)$ and $Y_{i+1}=Y_i-(X_i>>i)$ and determine the phase Δθ=Δθ+$θ_i$, if $Y_i>0$;

h) if i<N−1, return to f); and i) if i=N−1:
determine the phase shift as being equal to the phase Δθ and
determine the amplitude of the sense signal as being equal to K·$X_{N-1}$, being K=2·$\Pi_{i=0}^{N-1} \cos(θ_i)$.

6. The method of claim 1, wherein the rotation-matrix approach is performed by:

a) defining an index i having integer values ranging from 0 to N−1, with N being the number of samples per reference cycle;

b) determining a rotation amount as being equal to 360°/N and precalculating the (x_rot; y_rot)=(cos(360/N); sin(360/N)) rotation coordinates;

c) determining a starting coordinate set $X_0, Y_0$, where $x_0=\cos(φ_{ref})$, $y_0=\sin(φ_{ref})$, with $φ_{ref}$ being equal to the initial phase shift for the reference waves;

d) rotating the start coordinate set $X_0, Y_0$ by the rotation amount to produce a next coordinate set $X_1, Y_1$ as $X_1=X_0·x_{rot}-Y_0·y_{rot}$ and $Y_1=X_0·y_{rot}+Y_0·x_{rot}$;

e) incrementing i by 1;

f) rotate the coordinate set $X_1, Y_1$ by the rotation amount to produce an ith coordinate set $X_i, Y_i$ as $X_{i+1}=X_i·x_{rot}-Y_i·y_{rot}$ and $Y_{i+1}=X_i·y_{rot}+Y_i·x_{rot}$;

g) if i<N−1, return to e); and h) if i=N−1, reset the index to 0, and start over from c).

7. A system for driving micro-electro mechanical systems (MEMS) device, the system comprising:

a driver generating a drive signal for the MEMS device;

a sensor associated with the MEMS device and generating an output indicative of movement of the MEMS device;

an analog to digital converter digitizing the output of the sensor to produce a sense signal indicative of movement of the MEMS device;

a reference generator using a rotation-matrix approach to generate a reference cosine wave and a reference sine wave based upon a frequency drive signal, the reference cosine wave and reference sine wave each having an amplitude of 1 and a same frequency as that of the sense signal;

a processing circuit configured to:
multiply the sense signal by the reference sine wave to produce a first product;
multiply the sense signal by the reference cosine wave to produce a second product;
low-pass filter the first product to produce a first intermediate output;
low-pass filter the second product to produce a second intermediate output; and
perform a 4-quadrant CORDIC technique on the first and second intermediate outputs to thereby determine a phase shift between the sense signal and the drive signal as well as an amplitude of the sense signal;

a first error amplifier comparing the amplitude of the sense signal to a target amplitude to thereby produce an amplitude error as a difference therebetween;

a second error amplifier comparing the phase shift to a target phase shift to produce a phase error as a difference therebetween; and controller circuitry causing modifying of the drive signal based upon the phase error and the amplitude error so that the phase error and amplitude error are eliminated, wherein the controller circuitry comprises:

a phase controller generating a control signal based upon the phase error;

a programmable oscillator, generating the frequency drive signal based upon the control signal, the driver modifying phase of the drive signal based upon the frequency drive signal such that the phase error is eliminated; and an amplitude controller generating a voltage drive signal to the driver based upon the amplitude error, the driver modifying amplitude of the drive signal based upon the voltage drive signal such that the amplitude error is eliminated.

8. The system of claim 7, wherein the programmable oscillator comprises a phase locked loop (PLL).

9. The system of claim 7, wherein the processing circuit is an application specific integrated circuit (ASIC).

10. The system of claim 7, wherein the low-pass filtering of the first product performed by the processing circuit serves to remove intermodulation components from the reference sine wave; and wherein the low-pass filtering of the second product performed by the processing circuit serves to remove intermodulation components from the reference cosine wave.

11. The system of claim 7, wherein the low-pass filtering of the first product is performed by the processing circuit using a first decimation SINC filter; and wherein the low-pass filtering of the second product is performed by the processing circuit using a second decimation SINC filter.

12. The system of claim 7, wherein the processing circuit performs the 4-quadrant CORDIC technique by:

a) defining an index i having integer values ranging from 0 to N−1, with N being the total amount of CORDIC iterations;

b) precalculating N angles $θ_i$ such that for each of the N angles, $\tan(θ_i)=2^{-i}$;

c) determining a starting coordinate set $X_0, Y_0$ from the two SINC outputs (i.e. Y and X);

d) If X>=0, setting Δθ=0 as a starting point, else if X<0, then if Y>0 setting Δθ=+180, else setting Δθ=−180, and rotating the starting X, Y coordinates by 180° by setting X=−X and Y=−Y;

e) for a first number i=0 in the index, setting a next coordinate set $X_1, Y_1$ to be such that $X_1=X_0-(Y_0>>0)$ and $Y_1=Y_0+(X_0>>0)$ and determine a phase Δθ=Δθ−$θ_i$ if $Y_0 \leq 0$, but setting the next coordinate set $X_1, Y_1$ to be such that $X_1=X_0+(Y_0>>0)$ and $Y_1=Y_0-(X_0>>0)$ and determine the phase Δθ=Δθ+$θ_i$, if $Y_0>0$;

f) incrementing i by one;

g) for an ith number i in the index, setting a next coordinate set Xi, Yi to be such that $X_{i+1}=X_i-(Y_i>>i)$ and $Y_{i+1}=Y_i+(X_i>>i)$ and determine a phase Δθ=Δθ−$θ_i$ if $Y_i \leq 0$, but setting the next coordinate set $X_{i+1}, Y_{i+1}$ to be such that $X_{i+1}=X_i+(Y_i>>i)$ and $Y_{i+1}=Y_i-(X_i>>i)$ and determine the phase $\Delta\theta=\Delta\theta+\theta_i$, if $Y_i>0$;

h) if i<N−1, return to f); and i) if i=N−1:
  determine the phase shift as being equal to the phase $\Delta\theta$ and
  determine the amplitude of the sense signal as being equal to $K\cdot X_{N-1}$, being $K=2\cdot\Pi_{i=0}^{N-1}\cos(\theta_i)$.

13. The system of claim 7, wherein the processing circuit performs the rotation-matrix by:

a) defining an index i having integer values ranging from 0 to N−1, with N being the number of samples per reference cycle;

b) determining a rotation amount as being equal to 360°/N and precalculating the (x_rot; y_rot)=(cos(360/N); sin(360/N)) rotation coordinates;

c) determining a starting coordinate set $X_0$, $Y_0$, where $x_0=\cos(\varphi_{ref})$, $y_0=\sin(\varphi_{ref})$, with $\varphi_{ref}$ being equal to the initial phase shift for the reference waves;

d) rotating the start coordinate set $X_0$, $Y_0$ by the rotation amount to produce a next coordinate set $X_1$, $Y_1$ as $X_1=X_0\cdot x_{rot}-Y_0\cdot y_{rot}$ and $Y_1=X_0\cdot y_{rot}+Y_0\cdot x_{rot}$;

e) incrementing i by 1;

f) rotate the coordinate set $X_1$, $Y_1$ by the rotation amount to produce an ith coordinate set $X_i$, $Y_i$ as $X_{i+1}=X_i\cdot x_{rot}-Y_i\cdot y_{rot}$ and $Y_{i+1}=X_i\cdot y_{rot}+Y_i\cdot x_{rot}$;

g) if i<N−1, return to e); and h) if i=N−1, reset the index to 0, and start over from c).

14. A method of operating a micro-electro mechanical systems (MEMS) device, comprising:

generating a reference cosine wave and a reference sine wave, the reference cosine wave and reference sine wave each having an amplitude of 1 and a same frequency as that of a sense signal indicative of movement of the MEMS device;

multiplying the sense signal by the reference sine wave to produce a first product;

multiplying the sense signal by the reference cosine wave to produce a second product;

filtering the first product to produce a first intermediate output;

filtering the second product to produce a second intermediate output; and performing a technique on the first and second intermediate outputs to thereby determine a phase shift between the sense signal and the drive signal as well as an amplitude of the sense signal;

comparing the phase shift to a target phase shift to produce a phase error as a difference therebetween;

comparing the amplitude of the sense signal to a target amplitude to thereby produce an amplitude error as a difference therebetween; and modifying a drive signal for the MEMS device based upon the phase error and the amplitude error so that the phase error and amplitude error are eliminated by:
  generating a control signal based upon the phase error:
  generating the frequency drive signal based upon the control signal, and modifying phase of the drive signal based upon the frequency drive signal such that the phase error is eliminated; and
  generating a voltage drive signal to the driver based upon the amplitude error, and modifying amplitude of the drive signal based upon the voltage drive signal such that the amplitude error is eliminated.

15. The method of claim 14, further comprising digitizing the sense signal prior to multiplication by the reference sine and cosine waves; and wherein the reference sine and cosine waves are generated in digital form.

16. The method of claim 14, wherein the filtering of the first product serves to remove intermodulation components from the reference sine wave; and wherein the filtering of the second product serves to remove intermodulation components from the reference cosine wave.

17. The method of claim 14, wherein the filtering of the first product is performed using a first decimation filter, and wherein the filtering of the second product is performed using a second decimation filter.

* * * * *